United States Patent
Choi et al.

(10) Patent No.: US 9,664,717 B2
(45) Date of Patent: May 30, 2017

(54) FLEXIBLE TACTILE SENSORS AND METHOD OF MAKING

(71) Applicants: Jae-Won Choi, Copley, OH (US); Erik Daniel Engeberg, Boca Raton, FL (US); Kye-Shin Lee, Copley, OH (US); Ho-Chan Kim, Daegu-Si (KR)

(72) Inventors: Jae-Won Choi, Copley, OH (US); Erik Daniel Engeberg, Boca Raton, FL (US); Kye-Shin Lee, Copley, OH (US); Ho-Chan Kim, Daegu-Si (KR)

(73) Assignee: The University of Akron, Akron, OH (US)

( * ) Notice: Subject to any disclaimer, the term of this patent is extended or adjusted under 35 U.S.C. 154(b) by 227 days.

(21) Appl. No.: 14/396,980

(22) PCT Filed: Apr. 26, 2013

(86) PCT No.: PCT/US2013/038426
§ 371 (c)(1),
(2) Date: Oct. 24, 2014

(87) PCT Pub. No.: WO2013/163549
PCT Pub. Date: Oct. 31, 2013

(65) Prior Publication Data
US 2015/0109006 A1    Apr. 23, 2015

Related U.S. Application Data

(60) Provisional application No. 61/638,721, filed on Apr. 26, 2012.

(51) Int. Cl.
*G01R 27/08* (2006.01)
*G06F 3/045* (2006.01)
*G01R 27/02* (2006.01)
*B25J 13/08* (2006.01)
*G01B 7/00* (2006.01)
*G01L 1/04* (2006.01)
*G01P 3/50* (2006.01)
(Continued)

(52) U.S. Cl.
CPC ............ *G01R 27/02* (2013.01); *B25J 13/084* (2013.01); *G01B 7/00* (2013.01); *G01D 5/16* (2013.01);
(Continued)

(58) Field of Classification Search
CPC .......... G01R 27/00; G01R 27/02; G01R 3/00; G01L 1/04; G01L 1/10; G01L 1/20;
(Continued)

(56) References Cited

U.S. PATENT DOCUMENTS

| 4,634,917 A | 1/1987 | Dvorsky et al. |
| 5,060,527 A | 10/1991 | Burgess |

(Continued)

OTHER PUBLICATIONS

Jae-Won Choi; Structural Electronics as Future Printed Electronics Products; PowerPoint slides from presentation to KoPERA 2012 International Workshop; Mar. 2012.
(Continued)

*Primary Examiner* — Hoai-An D Nguyen
(74) *Attorney, Agent, or Firm* — Renner, Kenner, Greive, Bobak, Taylor & Weber Co. LPA

(57) ABSTRACT

A tactile sensor includes a flexible medium having electrically conductive strips embedded therein and extending in a first direction, said electrically conductive strips including conductive nanostructures dispersed in a flexible support material, said nanostructures selected from conductive nanowires, carbon nanotubes, and graphene, wherein each electrically conductive strip is connected at each end to an impedance measuring device that measures the impedance across each electrically conductive strip. The electrically conductive strips may be formed on a first layer of the flexible medium by using direct-write technology.

20 Claims, 21 Drawing Sheets

(51) Int. Cl.
*G01R 3/00* (2006.01)
*G01D 5/16* (2006.01)
*G06F 3/041* (2006.01)

(52) U.S. Cl.
CPC ............... *G01L 1/04* (2013.01); *G01P 3/50* (2013.01); *G01R 3/00* (2013.01); *G06F 3/045* (2013.01); *G06F 3/041* (2013.01)

(58) Field of Classification Search
CPC .......... G01L 1/22; G01N 27/02; G01N 27/04; G01N 17/00; G01P 3/50; G01D 5/16; G01B 7/00; B25J 13/084
USPC ......... 324/600, 649, 691; 345/156, 173, 174
See application file for complete search history.

(56) References Cited

U.S. PATENT DOCUMENTS

| | | |
|---|---|---|
| 8,099,023 B2 | 1/2012 | Law |
| 2005/0029099 A1 | 2/2005 | Eversmann et al. |
| 2005/0184641 A1 | 8/2005 | Armitage et al. |
| 2010/0093109 A1 | 4/2010 | Pugia et al. |
| 2012/0010316 A1 | 1/2012 | Meyer et al. |
| 2014/0055702 A1* | 2/2014 | Park ................ G02F 1/136286 349/43 |
| 2014/0356524 A1* | 12/2014 | Gao ........................ H01B 1/02 427/126.1 |

OTHER PUBLICATIONS

Jae-Won Choi; Structural Electronics as Future Printed Electronics Products; Abstract provided with KoPERA 2012 International Workshop; Mar. 2012.

Ning Hu et al.; Tunneling effect in a polymer/carbon nanotube nanocomposite strain sensor; Science Direct—Acta Materialia (2008) 2929-2936; Available online Mar. 24, 2008.

Hu, et al., Development of patterned carbon nanotubes on a 3D polymer substrate for the flexible tactile sensor application, Journal of Micromechanics and Microengineering, Oct. 7, 2011.

* cited by examiner

| Exp. | Fixed Parameters | | | Variable Parameters | | | | | | | | | | | | |
|---|---|---|---|---|---|---|---|---|---|---|---|---|---|---|---|---|
| 1 | No. of Exp. | $T_d$ (μm) | $S_t$ (mm/s) | $G_d$ (μm) | V (Volt) | | | | | | | | | | | |
| | 4 | 437 | 20 | 300-350 | 0.2 | 0.5 | 1.0 | 1.5 | 2.0 | 2.5 | 3.0 | 3.5 | 4.0 | 4.5 | 5.5 | |
| 2 | No. of Exp. | $T_d$ (μm) | V (Volt) | $G_d$ (μm) | $S_t$ ( mm/s) | | | | | | | | | | | |
| | 4 | 437 | 1.0 | 300-350 | 10 | 15 | 20 | 25 | 30 | 35 | 40 | 45 | 50 | 55 | 60 | 65 | 70 |

Fig. 22

FLEXIBLE TACTILE SENSORS AND METHOD OF MAKING

CROSS-REFERENCE TO RELATED APPLICATIONS

This application claims priority from U.S. Provisional Application No. 61/638,721 filed on Apr. 26, 2012, the contents of which are incorporated herein by reference.

FIELD OF THE INVENTION

The present invention relates to flexible tactile sensors and to methods of making them. The present invention further relates to flexible tactile sensors that are developed using direct-write technology from strips of electrically conductive nanostructures mixed within a polymer matrix that are embedded within a flexible elastomeric shell.

BACKGROUND OF THE INVENTION

There have been notable advances in the design and development of artificial robotic hands over the last several decades. The Utah/M.I.T. hand was developed over twenty years ago with three fingers and a thumb. More recently, the Gifu hand and the Shadow Hand have been developed with high levels of dexterity. Because the dexterity of these artificial hands is approaching that of human hands, tactile sensing is very important for the development of intelligent grasp control algorithms. Tactile sensing is also very important in upper limb prosthetics, where a number of mechanical advances have also been recently made. For example, the i-Limb has four fingers and a thumb with one motor for each digit. The Smarthand and Michelangelo hand also have five fingers.

One general problem for upper limb amputees is that they lack proprioceptive feedback about the grip force applied by their prostheses. For this reason, amputees are more likely to drop grasped objects because they do not know exactly how tightly the object is grasped. This is corroborated by recent surveys from amputees which indicate their desire for a level of automatic grasped object slip prevention. However, the detection and prevention of grasped objects from slipping is a difficult problem in general that is important not only for prosthetic hands but also for autonomous robots.

There are several approaches to enhance the flexibility of tactile sensors. The flexibility of silicon-diaphragm sensors can be increased through the incorporation of polymers during the fabrication process. Mounting the sensors on a flexible substrate or using polyimide layers as a connecting material between silicon-diaphragm sensors can also increase the flexibility of the sensors. Another approach is the use of compressible and flexible conductive sheets as a sensing material to increase the size and flexibility of tactile sensors. In this method, flexible sheets are sandwiched by conductive strips. Although these sensors provide good flexibility in a large area, their response, spatial resolution, and sensor size on a large area are limited. Control of dimensions of sensors and sensor elements during the fabrication process is another limitation.

Thus, more sophisticated and more flexible tactile sensing is essential for improved control of tele-operated robotics such as upper limb prostheses and laparoscopic and robot assisted surgery.

SUMMARY OF THE INVENTION

In a first embodiment, the present invention provides a tactile sensor comprising a flexible medium having an array of electrically conductive strips embedded therein and extending in a first direction, said electrically conductive strips including conductive nanostructures dispersed in a flexible support material, said nanostructures selected from conductive nanowires, carbon nanotubes, and graphene, wherein each electrically conductive strip is connected at each end to an impedance measuring device that measures the impedance across each electrically conductive strip.

In a second embodiment, the present invention provides a tactile sensor as in the first embodiment, wherein said flexible medium is stretchable.

In a third embodiment, the present invention provides a tactile sensor as in either the first or second embodiments, wherein said electrically conductive strips are aligned as straight strips, two-dimensional curved strips, three-dimensional curved strips, or wavy patterned strips.

In a fourth embodiment, the present invention provides a tactile sensor as in any of the first through third embodiments, wherein said impedance measuring device is a Wheatstone bridge.

In a fifth embodiment, the present invention provides a tactile sensor as in any of the first through fourth embodiments, wherein said flexible medium is made from polyurethane.

In a sixth embodiment, the present invention provides a tactile sensor as in any of the first through fifth embodiments, wherein said flexible support material is a polymer.

In a seventh embodiment, the present invention provides a tactile sensor as in any of the first through sixth embodiments, wherein said nanostructures are multi-walled carbon nanotubes.

In an eighth embodiment, the present invention provides a tactile sensor as in any of the first through seventh embodiments, wherein said electrically conductive strips contain from 0.01 wt % to 10 wt % carbon nanotubes.

In a ninth embodiment, the present invention provides a tactile sensor as in any of the first through eighth embodiments, wherein said carbon nanotubes have an average length from 300 nanometers to 30 microns.

In a tenth embodiment, the present invention provides a tactile sensor as in any of the first through ninth embodiments, wherein said sensor comprises four independent sensor units.

In an eleventh embodiment, the present invention provides a tactile sensor as in any of the first through tenth embodiments, wherein said sensor units each have a first array of electrically conductive strips extending in said first direction, and a second array of electrically conductive strips extending in a second direction that is off of parallel as compared to said first direction of said first array.

In a twelfth embodiment, the present invention provides a tactile sensor as in any of the first through eleventh embodiments, wherein the width of each electrically conductive strip is substantially constant throughout the length of each electrically conductive strip.

In a thirteenth embodiment, the present invention provides a tactile sensor as in any of the first through twelfth embodiments, further comprising a second array of electrically conductive strips extending in a second direction that is off of parallel as compared to said first direction of said first array.

In a fourteenth embodiment, the present invention provides a tactile sensor as in any of the first through thirteenth embodiments, wherein said second direction of said second array is orthogonal to said first direction of said first array.

In a fifteenth embodiment, the present invention provides a tactile sensor as in any of the first through fourteenth embodiments, wherein the tactile sensor detects applied force, slip events, slip direction, slip speed, slip velocity, rolling contact or the shape of an object in contact with said tactile sensor.

In a sixteenth embodiment, the present invention provides a method of making a tactile sensor, comprising pouring an elastomeric material into a mold to form a first layer of elastomeric material; curing the first layer of elastomeric material; depositing a mixture of prepolymer and carbon nanotubes on the first layer of elastomeric material to form conductive strips; curing the conductive strips; pouring an elastomeric material onto the first layer of elastomeric material and conductive strips to cover the first layer of elastomeric material and conductive strips to form a second layer of elastomeric material; and curing the second layer of elastomeric material.

In a seventeenth embodiment, the present invention provides a tactile sensor as in the sixteenth embodiment, wherein the first layer elastomeric material and second layer elastomeric material are comprised of stretchable polyurethane material.

In an eighteenth embodiment, the present invention provides a tactile sensor as in either the sixteenth or seventeenth embodiments, wherein the mixture of prepolymer and carbon nanotubes is deposited via a micro-dispensing head.

In a nineteenth embodiment, the present invention provides a tactile sensor as in any of the sixteenth through eighteenth embodiments, wherein the mixture of prepolymer and carbon nanotubes is directly cured into strips using UV light.

In a twentieth embodiment, the present invention provides a tactile sensor as in any of the sixteenth through nineteenth embodiments, wherein the steps of (b) through (e) are repeated in order to create a tactile sensor having multiple layers.

BRIEF DESCRIPTION OF THE DRAWINGS

FIG. 22 is a table showing the effect of dispensing parameters on the profile shape, accuracy and consistency of conductive strips.

DETAILED DESCRIPTION OF ILLUSTRATIVE EMBODIMENTS

The present invention relates to tactile sensors and to methods of making them. In some embodiments, the present invention further relates to tactile sensors that are developed using direct-write technology to lay down within a flexible medium multiple conductive strips of electrically conductive carbon nanotubes mixed within a polymer matrix.

Figure 1:
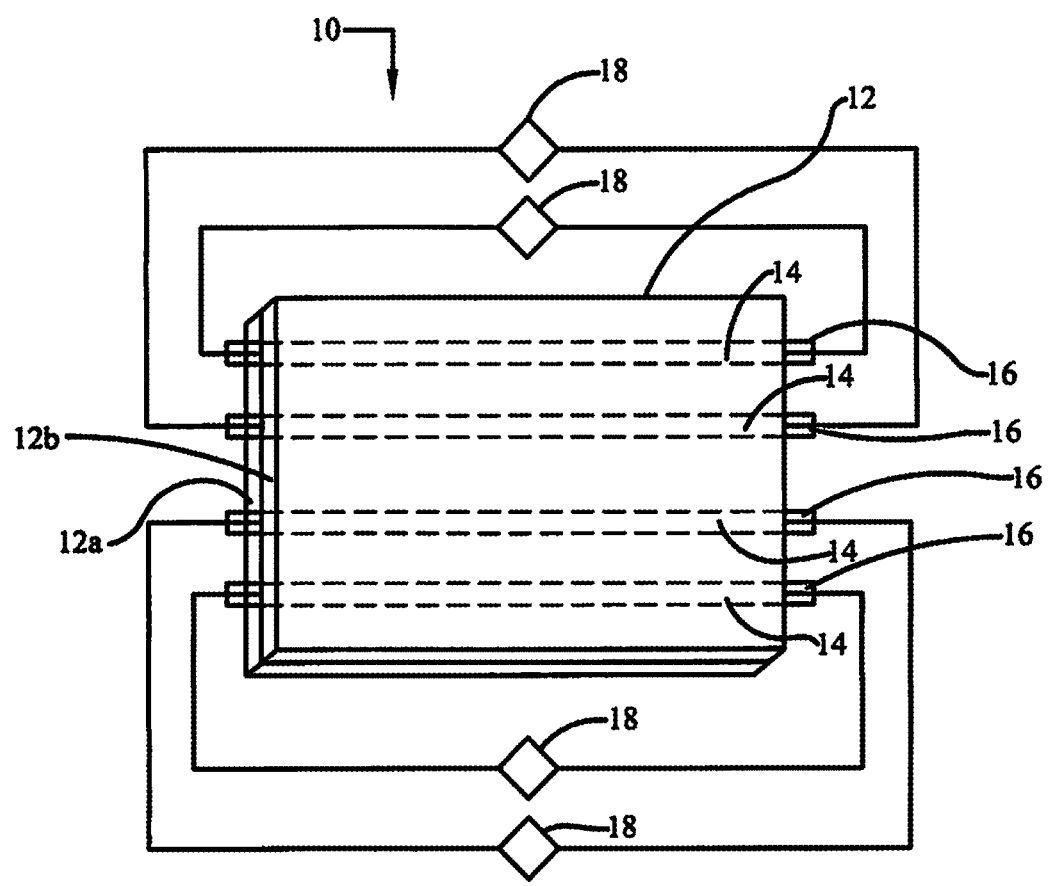
FIG. 1 is a schematic view of a tactile sensor comprising electrically conductive strips embedded in a flexible medium.

With reference to FIG. 1, one embodiment of the present invention provides a tactile sensor 10 comprising electrically conductive strips 14 embedded in a flexible medium 12. In this particular embodiment, the flexible medium is conveniently formed of a first layer elastomeric shell 12a and a second layer elastomeric shell 12b where the first layer elastomeric shell 12a is first laid down and the electrically conductive strips 14 placed thereon then subsequently surrounded by the second layer elastomeric shell 12b. But this is generally a manufacturing expedient (as will be described more fully below), and the present invention is broadly directed to the embedding of the electrically conductive strips 14 in a flexible medium 12. In some embodiments, the flexible medium 12 is not only flexible but also capable of being stretched. Thus, if employing the first and second layer elastomeric shells in such embodiments, they are both flexible and capable of being stretched.

The electrically conductive strips 14 can be aligned as straight strips, two-dimensional curved strips, three-dimensional curved strips, wavy patterned strips. The electrically conductive strips can also be aligned into any designed pattern.

Each conductive strip 14 is connected through end terminals 16 to an impedance measuring device 18. In some embodiments, the impedance measuring device is a half Wheatstone bridge, which includes a voltage source in series with a resistor. The impedance measuring device can be any such device known in the art. Impedance measuring devices work by applying a known or measured force to each strip while simultaneously measuring the change in impedance of the strip (or the voltage output from each half Wheatstone bridge). Then, the change in resistance or voltage is related back to the applied force. This relation back is then used to calculate a new, unknown force.

In some embodiments, the flexible medium 12 is formed from non-conductive flexible material. This is so the flexible medium does not interfere with the conduction of the conductive strips, as will be appreciated to a better degree after further disclosures herein. In some embodiments, suitable materials for flexible medium are selected from elastomers, polymers, and thermoplastics. In some embodiments, elastomers may be selected from polyepoxides rubber, natural polyisoprene, synthetic polyisoprene, polybutadiene, chloroprene rubber, butyl rubber, styrene-butadiene rubber, nitrile rubber, ethylene propylene rubber, epichlorohydrin, polyacrylic rubber, silicone rubber, fluorosilicone, fluoroelastomers, perfluorelastomers, polyether block amines, chlorosulfonated polyethylene, ethylene-vinyl acetate, thermoplastic elastomer, and polyurethane, or mixtures thereof. In one or more embodiments, the flexible medium is made from polyurethane. When multiple layers are employed to create the sensor, the layers may be the same or different.

The conductive strips 14 comprise conductive nanostructures dispersed in a flexible support material. As used herein, the term "conductive nanostructure" is meant to include conductive nanowires, carbon nanotubes, and graphene. In one embodiment, the flexible support material is a polymer. The polymer may be virtually any flexible polymer.

In some embodiments, the conductive strips have a width of from 5 microns or more to 3 mm or less. In some embodiments, the conductive strips have a width of from 10 microns or more to 2 mm or less. In some embodiments, the conductive strips have a width of 10 microns or more to 1 mm or less.

Embodiments of the present invention use CNTs for their mechanically strong, electrically conductive, and piezoresistive properties. The carbon nanotubes can be single-walled or multi-walled. Single-walled nanotubes are carbon nanotubes where the tube has only one layer. Multi-walled nanotubes are carbon nanotubes where the tube has more than one layer. These nanotube structures and additional nanotube structures are known by those skilled in the art.

In some embodiments, the CNTs have exceptionally high aspect ratio of from 500 or more to 1000 or less). In some embodiments, the CNTs have high Young's modulus of 0.64 TPa or higher. In some embodiments, the CNTs have a high stiffness of 1,000 GPa or higher. In some embodiments, the CNTs have high tensile strength of 100 GPa or higher. In some embodiments, the CNTs have a bulk density of 1.4 g/cm$^3$ or lower. In some embodiments, the CNTs have a bulk density in the range of about 0.15 g/cm$^3$ to about 1.3 g/cm$^3$. In other embodiments, the CNTs have the ability to withstand large strain rates of from 6% or more to 10% or less. In addition to their outstanding physical and mechanical properties, CNTs show exceptional electrical properties. Depending on their radius or chirality, CNTs can be metallic or semiconducting, and both are suitable for use in accordance with the present invention.

Metallic CNTs have exceptionally low electrical impedance of around 0.5Ω, and piezoresistivity (gauge factor around 600 to 1000 in a small scale). Dispersing CNTs into a polymer matrix reinforces the polymer in order to ameliorate the mechanical properties, and also embeds a highly conductive electrical element within the polymer.

The length of the CNTs can have an effect on the tunneling resistance of the conductive strips, and, for more sensitive sensors, it is preferred that the CNTs be short to product more junctions between neighboring CNTs along the length of the strips. In some embodiments, the CNTs have an average length from 300 nanometers or more to 30 microns or less. In other embodiments, the CNTs have an average length from 500 nanometers or more to 20 microns or less. In other embodiments, the CNTs have an average length from 1 micron or more to 5 microns or less.

In some embodiments, the carbon nanotubes have a purity of more than 85 wt %, diameter from 10 to 30 nm, and length from 5 to 20 μm.

In one or more embodiments, the conductive structures are metal nanowires. The metal nanowires can be made from copper, silver, gold, or mixtures thereof. The metal nanowires can be made from any conductive metal that is known in the art as being able to form nanowires.

The length of the nanowires can have an effect on the tunneling resistance of the conductive strips, and, for more sensitive sensors, it is preferred that the nanowires be short to product more junctions between neighboring nanowires along the length of the strips. In some embodiments, the nanowires have an average length from 300 nanometers or more to 30 microns or less. In other embodiments, the nanowires have an average length from 500 nanometers or more to 20 microns or less. In other embodiments, the nanowires have an average length from 1 micron or more to 5 microns or less.

The graphene additions are generally planar and will have length and width dimensions. In some embodiments, the length and width is from 300 nanometers or more to 30 microns or less. In other embodiments, the length and width is from 500 nanometers or more to 20 microns or less. In other embodiments, the length and width is from 1 micron or more to 5 microns or less.

The prepolymer used to form the carbon nanotube-filled polymer can be any stretchable prepolymer that is capable of mixing with carbon nanotubes. The prepolymer is mixed with carbon nanotubes before being polymerized to form the electrically conductive strips 14.

The prepolymer is mixed with a curing agent in order to cure the solution into strips. The curing agent can be thermally initiated by adding heat, or can be initiated by light, such as with UV, visible, or infrared light, depending on the photoinitiator.

For ease of manufacture, in one or more embodiments, the prepolymer is a material that is photocurable or photocrosslinkable. Photocrosslinking properties provide a way to directly cure the deposited materials, whereas in the conventional direct write or printed electronics, a post-baking process is required. In one embodiment, the present invention provides a sensor wherein a post-baking process is not required.

In particular embodiments, the prepolymer is selected from the groups consisting of cyclic trimehylolpropane formal acrylate, Cyclic Trimehylolpropane Formal Acrylate mixed with Acrylate Ester, Tango Plus (a commercially available photocurable material from Objet Co.), and mixtures thereof.

In some embodiments, the prepolymer is selected from propoxylated neopentyl glycol diacrylate, propoxylated glyceryl triacrylate, aromatic urethane acrylate, urethane acrylate, cyclic trimehylolpropane formal acrylate, acrylate easter, aromatic monoacrylate, ethoxylated bisphenon a dimethacrylate, and mixtures thereof. In some embodiments, the prepolymer is selected from commercial 3D Printing photopolymers such as Objet TangoBlackPlus Fullcure980, TangoPlus FullCure930, TangoBlack FullCure970, and TangoGray FullCure950, and mixtures thereof.

In one or more embodiments, the prepolymer is prepared by blending a photoinitiator with a monomer or oligomer in order to aid in the process of photocuring the prepolymer. The photoinitiator may be chosen from 2,2-dimethoxy-2-phenylacetophenone, acyl phosphine oxides, bisacryl phosphine oxides, bis(2,4,6-trimethylbenzoyl) phenylphophine oxide, benzoin ethyl ether, 5,7-diiodo-3-butoxy-6-fluorone, and mixtures thereof. In one or more embodiments, commercial 3D printing photopolymers can be used without using a photoinitiator. In one or more embodiments, commercial 3D printing photopolymers are mixed with an additional photoinitiator when it they are mixed with a monomer or oligomer.

In one or more embodiments, the conductive strips comprise from 0.01 or more to 10 or less weight percent (wt %) nanostructures, in another embodiment, from 0.05 or more to 7.5 or less weight percent (wt %) nanostructures, in another embodiment, from 0.5 or more to 5 or less weight percent (wt %) nanostructures and in yet another embodiment, from 1 or more to 3 or less weight percent (wt %) nanostructures, based upon the total weight of the conductive strips.

In one or more embodiments, the conductive strips comprise 0.01 or more weight percent (wt %) nanostructures, in another embodiment, 0.05 or more weight percent (wt %) nanostructures, in another embodiment, 0.5 or more weight percent (wt %) nanostructures and in yet another embodiment, 1 or more weight percent (wt %) nanostructures, based upon the total weight of the conductive strips.

In one or more embodiments, the conductive strips comprise 10 or less weight percent (wt %) nanostructures, in another embodiment, 7.5 or less weight percent (wt %) nanostructures, in another embodiment, 5 or less weight percent (wt %) nanostructures and in yet another embodiment, 3 or less weight percent (wt %) nanostructures, based upon the total weight of the conductive strips.

The end terminals 16 can be selected from any conductive material. In one or more embodiments, the end terminals are made from copper, silver, gold, lead, carbon black, or mixtures thereof.

The conductive strips 14 form the sensing aspect of the sensor 10. Because the carbon nanotubes are electrically conductive, the impedance and voltage can be measured across the strips 14, by the impedance measuring device 18. The electrical properties of the strips 14 are first measured at a steady-state position. Because the resistance of conductive strips is dependent upon their length, the impedance of each conductive strip within the sensor changes when a force is applied to bend and change the length of each strip.

Figure 2:
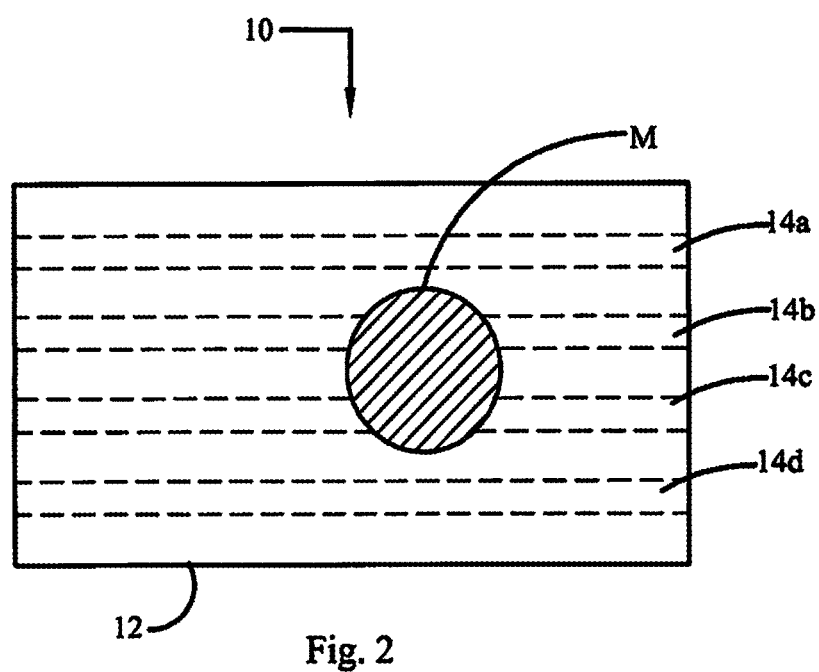
FIG. 2 is a schematic top view of a tactile sensor comprising electrically conductive strips embedded in a flexible medium showing an object thereon.

By measuring the impedance at each individual strip, the location of a force can be noted in one dimension. For example, with reference to FIG. 2, an object M placed on the sensor 10 such that it presses on two adjacent strips 14b and 14c, and not on strips 14a and 14d causes an impedance change across strips 14b and 14c, and thus the object can be characterized as being positioned somewhere between strips 14a and 14d, though the position of the object M between the left and right ends of the sensor 10, i.e., along the length of strips 14b and 14c, cannot be determined.

Figure 3:
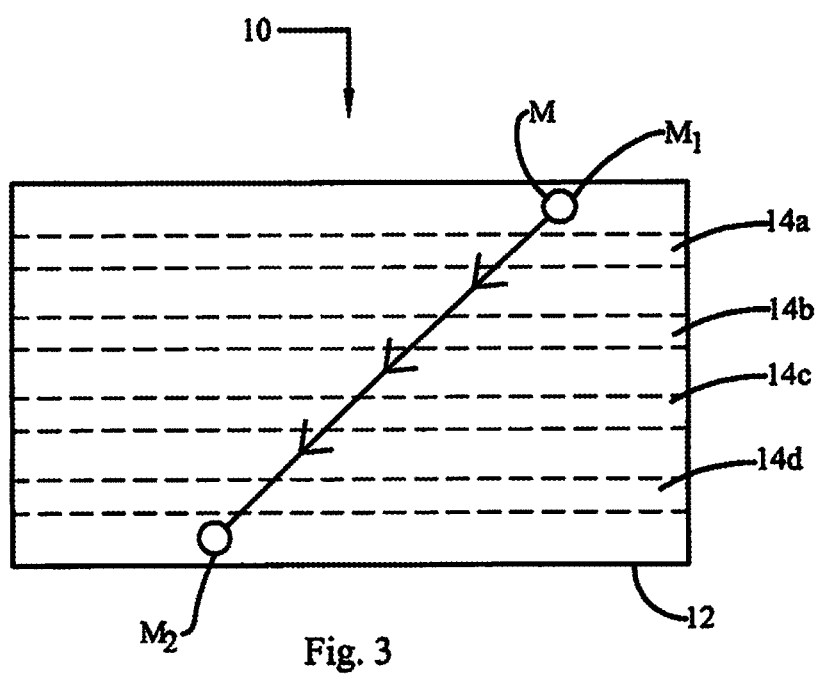
FIG. 3 is a schematic top view of a tactile sensor comprising electrically conductive strips embedded in a flexible medium showing an object moving thereacross.

Further, by measuring impedance at each individual strip, the direction of a slip event can be determined By slip event it is meant a moving force across the sensor. When a slip event occurs as movement along a strip, sensing the vibrations of the object can be an indicator of movement along a strip. With reference to FIG. 3, an object M sliding on the sensor from position M1 to position M2 will cause an impedance change at different strips 14a-14d at different times, first causing a change at 14a, then 14b, 14c and finally 14d. Thus it can be determined that the object is moving or "slipping" downwardly. This is valuable data, as, in the area of robotics, a slip event can be cause for increasing the grip force.

In one embodiment, sensors of the present invention can be biomimetic in the sense that they can have mechanical compliance similar to the human fingertips. The sensors can also be used to detect force at distinct locations of applied pressure and slip. Furthermore, by examining the relative timing of the force signals from adjacent conductive strips, the sensors can be used to detect slip and the direction that slip occurs. This is similar to the way that people can determine the direction that forces are applied through the relative timing of action potentials from mechanoreceptors within the fingertip.

The principle for detecting slip is based on the fact that high frequency mechanical vibrations occur when one object slips against another object. Different objects exhibit different vibrations in the frequency domain. Pressing an object against the surface of a tactile sensor (without slip) and sliding the same object against the surface of the sensor (to simulate slip) results in a difference in frequency. The difference in the frequency domain between these two tactile events can be characterized with a fast Fourier transform (FFT). The FFT can be performed in MATLAB on the raw, unfiltered voltage recorded from the output of a Wheatstone half bridge to illustrate the differences between the slip and nonslip events in the frequency domain.

Sensors of the present invention can also distinguish between slip and nonslip events. This is done by analyzing the resultant voltage spikes from sliding an object upward and downward along the surface of the sensor versus the resultant voltage spikes from the sensor being rapidly pressed. In one embodiment, sensors of the present invention allow the force to be measured at distinct locations on the surface of the sensor with low cross talk.

Notably, though object M of FIG. 3 moves diagonally across the strips 14a-14d, the only data obtained is that the object M moves downwardly, as movement across individual strips is not discernable from the impedance data. Just as the size of object M along the length of the strips is not accurately discernable. Thus, in other embodiments of this invention, sensors are provided with a second layer of strips extending in a direction that is off parallel as compared to the direction the first layer of conductive strips extend.

Figure 4:
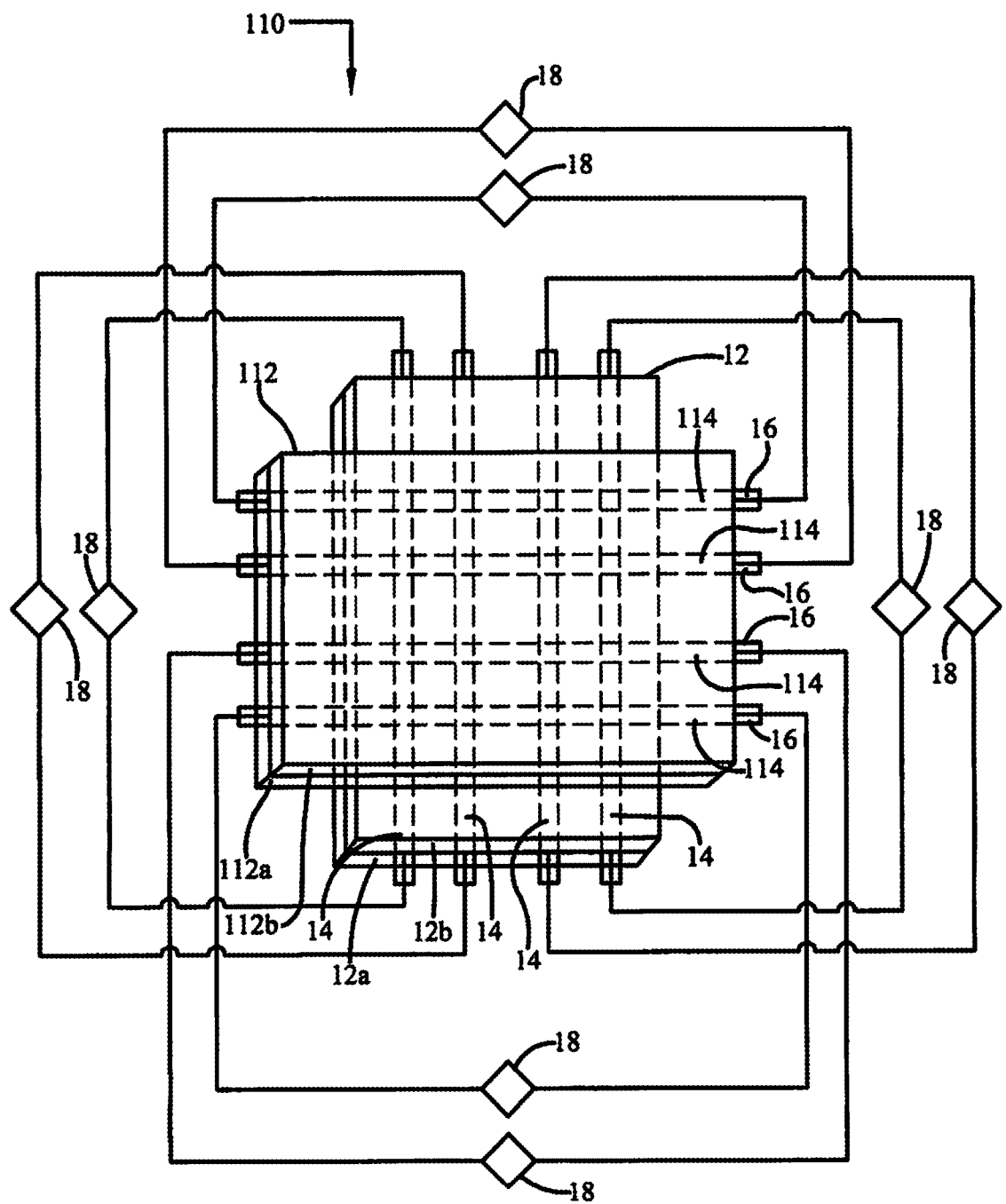
FIG. 4 is a schematic view of a tactile sensor comprising electrically conductive strips embedded in a flexible medium where the sensor comprises an additional flexible medium and an additional layer of electrically conductive strips.

With reference to FIG. 4, a second embodiment of the present invention provides a tactile sensor 110 comprising electrically conductive strips 14 embedded in flexible medium 12 and electrically conductive strips 114 embedded in flexible medium 112. In this particular embodiment, flexible medium 12 is again conveniently formed of a first layer elastomeric shell 12a and a second layer elastomeric shell 12b where the first layer elastomeric shell 12a is first laid down and the electrically conductive strips 14 placed thereon then subsequently surrounded by the second layer elastomeric shell 12b. In this particular embodiment, flexible medium 112 is conveniently formed of a first layer elastomeric shell 112a and a second layer elastomeric shell 112b where the first layer elastomeric shell 112a is first laid down (on top of the second layer elastomeric shell 12b) and the electrically conductive strips 114 placed thereon then subsequently surrounded by the second layer elastomeric shell 112b. This is only a manufacturing expedient, and the main focus of this embodiment is to provide first and second arrays of electrically conductive strips in a flexible medium, wherein the second array of electrically conductive strips extend off parallel as compared to the first array of electrically conductive strips.

In this embodiment, elastomeric shell 112 partially covers elastomeric shell 12. In other embodiments, elastomeric shell 112 is extended to fully cover elastomeric shell 12.

The present embodiment is broadly directed to the embedding of the electrically conductive strips 14 in a flexible medium 12 and the embedding of the electrically conductive strips 114 in a flexible medium 112. In some embodiments, the flexible medium 12 and flexible medium 112 are not only flexible but also capable of being stretched. Thus, if employing the first and second layer elastomeric shells in such embodiments, they are both flexible and capable of being stretched.

The electrically conductive strips 14 and electrically conductive strips 114 can be aligned as straight strips, two-dimensional curved strips, three-dimensional curved strips, wavy patterned strips. The electrically conductive strips can also be aligned into any designed pattern.

Each conductive strip 14 and conductive strip 114 is connected through end terminals 16 to an impedance measuring device 18. In some embodiments, the impedance measuring device 18 is a Wheatstone bridge.

The embodiment in FIG. 4 is presented to show a flexible medium 112 having a second layer of electrically conductive strips 114. The second layer of electrically conductive strips 114 is placed on top of the elastomeric shell 12. Although this embodiment only shows two arrays/layers of electrically conductive strips, sensors of the present invention can have any number of arrays/layers of electrically conductive strips.

In one or more embodiments comprising multiple layers of electrically conductive strips, the direction of the strips in the next layer (such as electrically conductive strips 114) is non-parallel to the direction of the strips in the preceding layer (such as electrically conductive strips 14). In other embodiments, the direction of the strips in the next layer (such as electrically conductive strips 114) is orthogonal to the direction of the strips in the preceding layer (such as electrically conductive strips 14).

Sensor 110 works with similar principles as sensor 10. The conductive strips 14 and conductive strips 114 form the sensing aspect of the sensor 110. Because the carbon nanotubes are electrically conductive, the impedance and voltage can be measured across the strips 14 and strips 114, by the impedance measuring device 18. The electrical properties of the strips 14 and strips 114 are first measured at a steady-state position. Because the resistance of conductive strips is dependent upon their length, the impedance of each conductive strip within the sensor changes when a force is applied to bend and change the length of each strip.

Figure 5:
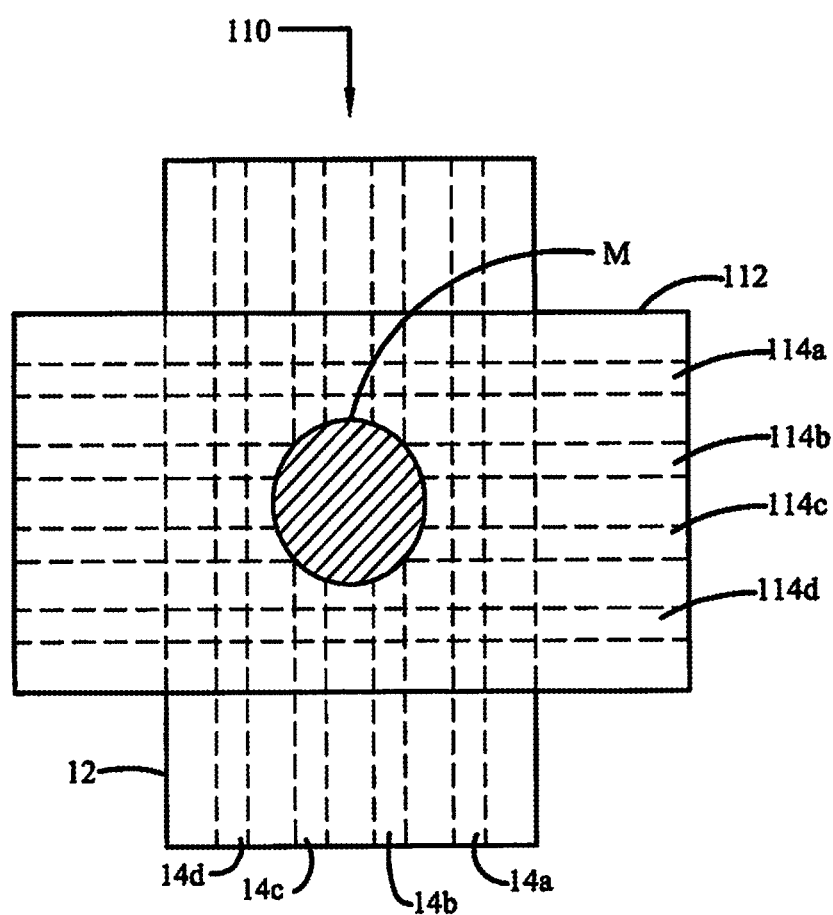
FIG. 5 is a schematic top view of a tactile sensor comprising electrically conductive strips embedded in a flexible medium where the sensor comprises an additional flexible medium and an additional layer of electrically conductive strips, where the sensor has an object thereon.

In embodiments such as FIG. 5 that have more than one layer of electrically conductive strips, the location of a force can be noted in more than one dimension. For example, with reference to FIG. 5, an object M placed on the sensor 110 such that it presses on adjacent strips 14b and 14c and now also presses on adjacent strips 114b and 114c. This causes an impedance change across strips 14b and 14c as well as strips 114b and 114c, and thus the object can be characterized as being positioned somewhere between strips 14a and 14d as well as somewhere between strips 114a and 114d. Because of the additional layer of electrically conductive strips, additional information can be determined by sensor 110 that cannot be determined by sensor 10.

Figure 6:
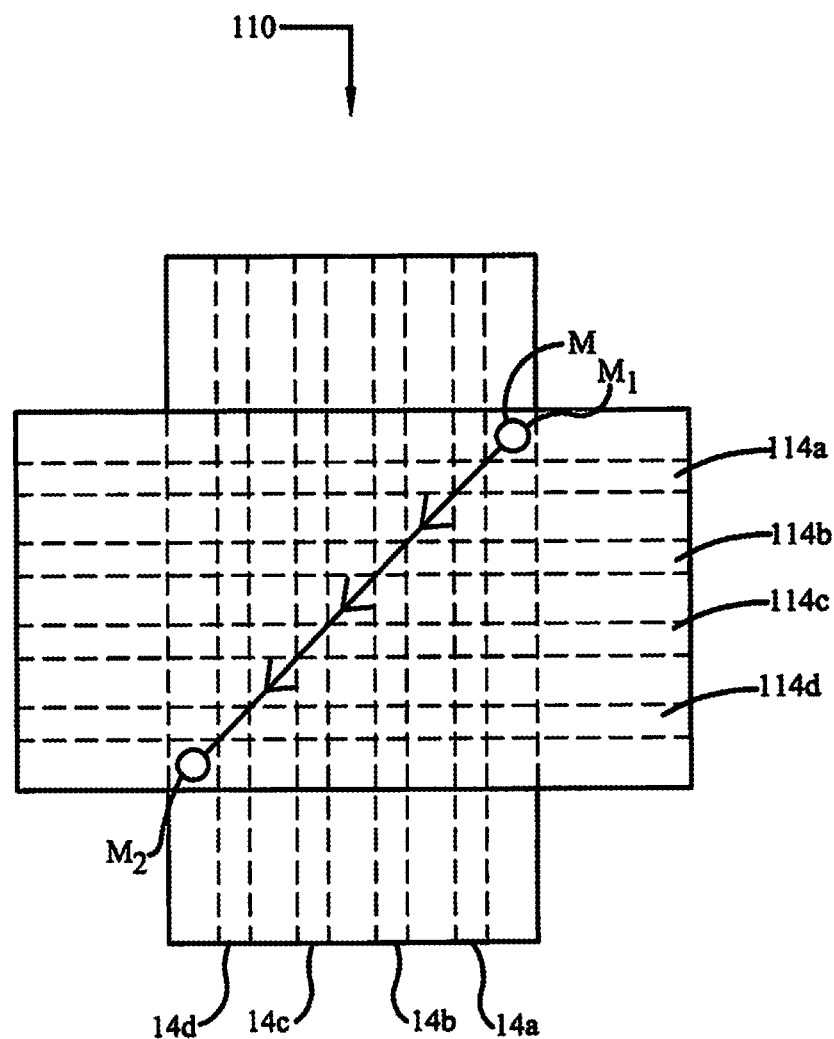
FIG. 6 is a schematic top view of a tactile sensor comprising electrically conductive strips embedded in a flexible medium where the sensor comprises an additional flexible medium and an additional layer of electrically conductive strips, where the sensor has an object moving thereacross.

Further, by measuring impedance at each individual strip, the direction of a slip event can be determined by sensor 110. With reference to FIG. 6, an object M sliding on the sensor from position M1 to position M2 will cause an impedance change at different strips 14a-14d and different strips 114a-114d at different times, first causing a change at 14a and 114a, then 14b and 114b, then 14c and 114c and finally 14d and 114d. Thus it can be determined that the object is moving or "slipping" downwardly. This is valuable data, as, in the area of robotics, a slip event can be cause for increasing the grip force.

Although the sensors embodied in FIG. 1 through FIG. 6 are generally rectangular, sensors of the present invention can take any shape. Sensors of the present invention can be cylindrical, conical, spherical, or combinations thereof. Sensors of the present invention can take any designed three-dimensional shape.

Figure 21:
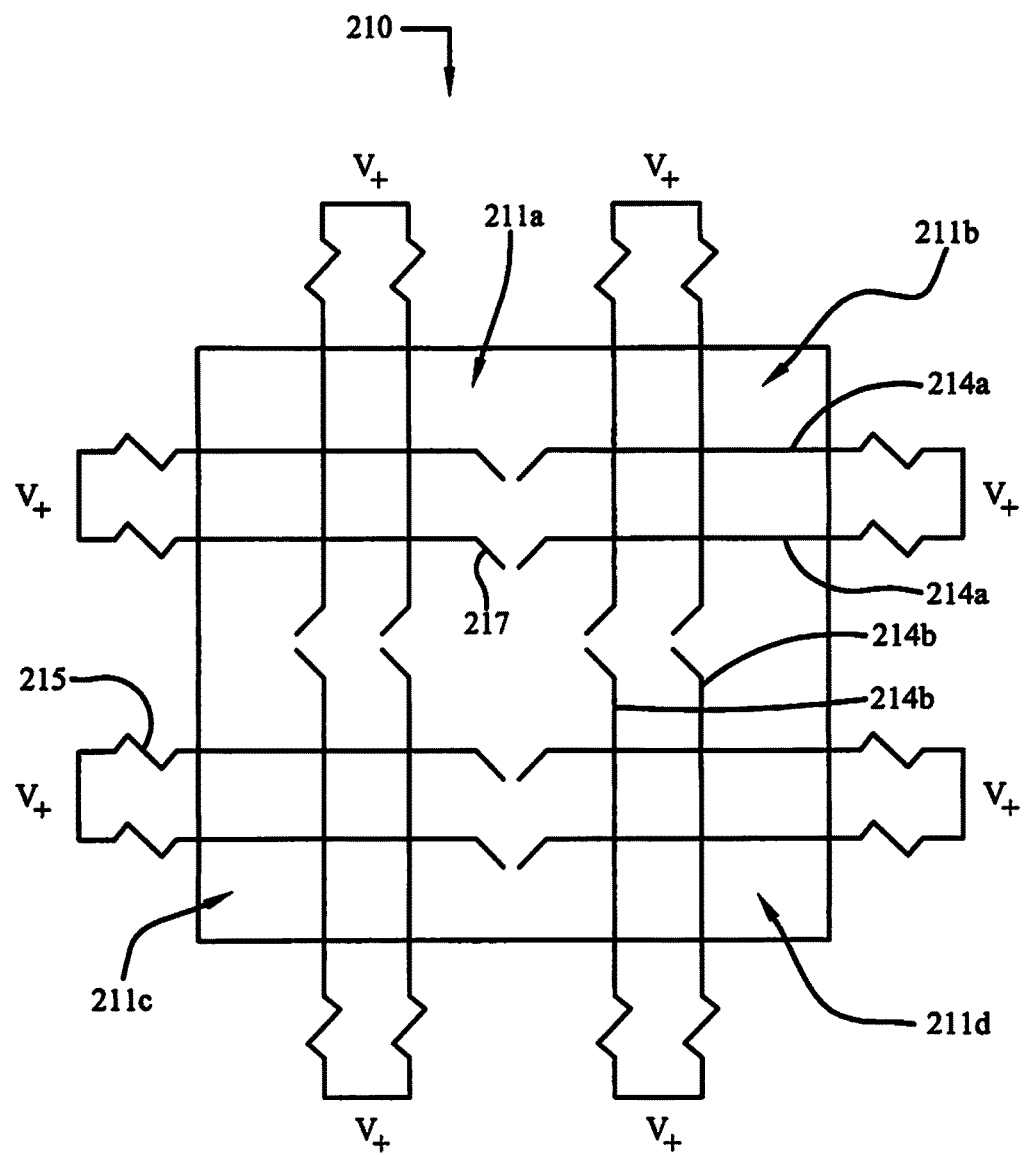
FIG. 21 is a schematic view of a representative portion of a tactile sensor comprising multiple sensor units to improve the ability to detect the location of an applied force or slip event

With reference to FIG. 21, a representative portion of an embodiment of a tactile sensor 210 comprising four sensor units 211a, 211b, 211c and 211d, each with a first array of electrically conductive strips 214a (horizontal, in figure) and a second array of electrically conductive strips 214b (vertical, in figure) embedded in a flexible medium 212 such that the sensor 210 comprises four independent sensing zones. It should be appreciated that the first and second arrays are in different layers as described above. Each unit is shown with a 2 by 2 strip array, but any number of strips can be practiced. Also, any number of sensor units can be used. One end of each strip in each array of electrically conductive strips is connected to a resistor 215 of known resistance, the resistor being in series with a voltage source represented a V+. The voltage sources represented at V+ may all be from the same source or from different sources. The other end of each strip is connected to a ground 217. In some embodiments, the ground is common to one or more or even all zones. Other impedance measuring devices and methods can be practiced. It should be appreciated that this is a diagrammatic representation only, and the relative spacing between neighboring units and strips can be selected as desired. Additionally, numbering of every element is not repeated for each unit as that would clutter the drawing.

Sensors comprising such sensor units will provide better sensing capabilities because the units divide the surface area of the sensor into discrete zones, each of which can provide independent sensing of applied force and slip. These zones can be very small and thus provide specific data as to the location of the applied force or slip, particularly as compared to prior embodiments not providing discrete zones.

Although other methods to create the structure and to achieve the functioning of a sensor in accordance with this invention may be developed, the present invention also provides a method of making a tactile sensor. The tactile sensors and method of making will now be described in greater detail. It should be noted that the specific materials and the specific process conditions disclosed in the following disclosures are given only as examples within the scope of the invention, and this invention should not be limited to these materials or process conditions as such.

One embodiment of the present invention provides a method of producing a tactile sensor by embedding electrically conductive strips in a flexible medium. In a particular embodiment, a tactile sensor is produced by first forming a first layer elastomeric shell, then placing the electrically conductive strips on the first layer elastomeric shell, then laying down a second layer elastomeric shell to fully cover the first layer elastomeric shell and electrically conductive strips. In one or more embodiments, a sensor includes an additional layer of electrically conductive strips that are embedded in an additional elastomeric shell. Sensors of the present invention can have any number of layers of electrically conductive strips and any number of elastomeric shells.

In one or more embodiments, the flexible medium is formed by placing an appropriate elastomeric material into a mold to form a first layer. This first layer is then cured to set its form.

In one or more embodiments, a layer of the flexible medium can be formed using any curable elastomers in ambient conditions. In one or more embodiments, a layer of the flexible medium can be formed using room temperature and no vacuum.

After formation of the first layer, the conductive strips are laid down. First, the prepolymer and CNT mixture must be made. The carbon nanotube/prepolymer mixture is formed by combining carbon nanotubes with a suitable prepolymer and photoinitiator where necessary. The solution is then mixed until the carbon nanotubes are sufficiently dispersed within the prepolymer. This mixture is patterned onto the first layer to form the conductive strips.

In one embodiment, the photoinitiator is first blended with the prepolymer using a magnetic stirrer. Then, the carbon nanotubes are dispersed into the prepolymer solution.

In one or more embodiments, the mixture is sonicated to improve CNT dispersion. During sonication, ultrasound propagation in the solution results in growth of cavities. The implosion of these cavities leads to violent and localized release of energy which can separate and disperse individual CNTs from bundles and agglomerates, where cavitation and wave propagation are directly related to the viscosity of liquid. Non-uniform energy release distribution during sonication leads to weak and non-homogeneous dispersion especially in medium to high viscosity liquid. To overcome this problem and prevent the localization of the high-energy ultrasound field around the tip of the sonicator, a combination of sonicator and magnetic stirrer can be used to globally disperse the CNTs in the prepolymer. In one or more embodiments, the prepared solution can be degassed under a vacuum. In one embodiment, the solution is degassed for 5 hours. In some embodiments, the mixture is sonicated (Q700, Qsonica, Newtown, Conn.) for 90 min and filtered using a 200 micron filter (Sterlitech, Kent, Wash.).

The conductive strips can be placed onto a layer of elastomer using any technology known in the art. The conductive strips are ultimately cured and can be cured by any technology known in the art. In one or more embodiments, the deposited materials are directly cured. In one or more embodiments, the conductive strips are cured using UV, visible, or infrared light depending on photoinitiator type. Other methods of curing the conductive strips include thermal curing using a thermal initiator, such as 2,2'-azobis(2-methyl-propionamidine) dihydrochloride, 2,2'-azobis(2-methylpropionitrile), benzoyl peroxide, and mixtures thereof).

In one embodiment, the conductive strips are placed onto a layer of elastomer using direct-write technology. Direct-write (DW) technology is a maskless process to create conductive patterns on virtually any surface. With this technology, translation mechanisms are utilized to position a dispensing head to extrude a conductive material on a substrate which forms a functional wire pattern.

A direct-write system comprises a micro-dispensing tip and a means for directly curing the dispensed material. Direct-write applications include robotic tactile sensors and soft molding.

In one embodiment, sensors of the present invention are prepared by a computer controlled DW system using a screw-driven micro-dispensing head (PCD3, GPD Global, Grand Junction, Colo.) installed on a high precision xyz translation stage with a 500 nm resolution (Aerotech, Pittsburgh, Pa.). Then, a four-leg optical fiber with a high-power UV lamp (OmniCure S2000, Lumen Dynamics Group Inc., Ontario, Canada) can be installed around the dispensing head to directly cure the dispensed material.

One schematic of the developed DW system comprises the xyz stage, micro-dispensing device, and curing system. Controlling the speed of the xyz stage, the gap distance between the tip and substrate, and the dispensing speed regulated by the input voltage of the dispensing head can be used to form a precise and consistent shape of deposited sensor elements.

In one or more embodiments, the electrically conductive strips or wires possess a consistent width throughout the length of each strip. Dispensing parameters directly affect the size and resolution of the dispensed material. Several parameters affect the ability to maintain continuous and smooth flow of the material delivered from the dispensing tip to the substrate surface. The width of the strips decreases as the flow rate increases and too low flow rate does not create consistent and continuous line widths. Another parameter is the translation speed. Translation speed is the speed of the stage underneath the dispensing tip. In one embodiment the translation speed is from 20 mm/sec or more to 30 mm/sec or less. In one embodiment the translation speed is 15 mm/sec or more and in other embodiments the translation speed is 35 mm/sec or less. High flow rates and slow translation speeds result in inconsistent line widths of conductive elements. Excessively fast translation speed and slow fluid flow rate also creates discontinuous or inconsistent line widths.

Variation of the gap distance between the tip and the substrate also causes inconsistent line widths. Where polyurethane material is used as the substrate, the surface is flexible with a relatively broad surface area. Here, small variations in gap distance are unavoidable. However, the use of a highly accurate and uniform substrate and/or real-time distance measurement device installed in the dispensing head would be a method to reduce this variation in gap distance, thereby giving more consistency to the line width.

Material agglomeration generated during the dispersion process is another source of line width variation. The agglomerated material sometimes partially occluded the tip and resulted in a pressure change in the tip. This pressure change caused inconsistent line widths. The material agglomeration can be improved by using a better material dispersion process and chemicals such as surfactants and/or dispersants. Finally, vibrations during the manufacturing process also may affect the line width.

Several sets of preferred parameters can be chosen to achieve consistent line widths. In one embodiment, the parameters are a flow rate from about 0.16 ml/V·min or more to 0.18 ml/V·min or less, translation speed of about 20 mm/s, and a line width of about 0.8 mm.

After curing the conductive strips, a cover layer of elastomer is applied and cured to form the protective flexible medium around the strips. Preferably the flexible medium surrounds the strips so that the strips are covered with a thickness of from 200 microns or more to 5 mm or less to each face, in other embodiments, from 1 mm to 5 mm and, in other embodiments, from 1 mm or more to 2 mm or less.

This process can be repeated, in that conductive strips can be laid down on the prior cover layer, and then in their turn covered, and so on, to create any desired number of layers of conductive strips at any desired orientation to preceding layers.

In one embodiment, this invention provides a method to produce polymeric tactile sensors using direct write (DW) and soft molding technologies. One particular method of producing a tactile sensor is:
(a) pour stretchable polyurethane material into a mold
(b) cure the polyurethane material to form a first layer
(c) deposit stretchable and photocrosslinkable prepolymer filled with carbon nanotubes (CNTs) via a micro-dispensing head
(d) directly cure the prepolymer filled with carbon nanotubes into strips or patterns using UV light, and
(e) add a next layer of polyurethane material to cover the cured patterns.

The steps of (b) through (e), can be repeated in order to create a sensor having multiple layers. A sensor with multiple layers has more sensing elements.

IV. Sensor

This material design enables the fabrication of a mechanically compliant and electrically conductive tactile sensor. Advantageously, tactile sensors of the present invention are mechanically compliant to facilitate delicate grasping procedures and to be more suited for a wider range of applications.

The conductive strips can function as sensors through the use of a half Wheatstone Bridge. Resistors of comparable impedance can be placed in series with each conductive strip to create a half Wheatstone Bridge for each conductor. The voltage from each half-bridge can be measured with MATLAB/Simulink (The MathWorks, Natick, Mass.) with the realtime Windows target kernel. In one embodiment, the sample rate is 1 kHz.

A sensor can be calibrated by applying a known or measured force to each strip while simultaneously measuring the change in impedance of the strip (or the voltage output from each half Wheatstone bridge). Then, the change in resistance or voltage is related to the applied force. In one embodiment, a sensor is calibrated by pressing on each conductive strip with a LSP-10 load cell (Transducer Techniques, Temecula, USA). The applied force is measured while the resultant voltage change from each half bridge is measured with Simulink. Sensors of the present invention are able to measure force at distinct points on the surface and can distinguish between slip and nonslip tactile events.

Sensors of the present have many beneficial applications. These applications include any robotic system where control of force is required (e.g. assembly lines), diagnostics (e.g. determining if antilock brakes prevent slip), prosthetic limbs, conformal or wearable electronics (e.g. head-band thermometer), biomedical instruments and measurement (e.g. foot pressure measurement for customized shoes, body-type collection chair, bedsore-free bed), electronics embedded in structural components, and implantable electronics with biocompatible materials.

Sensors of the present invention can be used to measure both shear and normal forces.

EXAMPLES

Example 1

Materials

To fabricate flexible robotic tactile sensors, flexible and conductive materials for wires and a flexible material for a substrate were used. Cyclic trimethylolpropane formal acrylate (Sartomer USA, LLC, Exton, Pa.), which is a flexible, tough, and photocrosslinkable acrylate-based monomer was used as a base solution. In this solution, multi-walled carbon nanotubes (MWCNTs) were dispersed using an ultrasonic bath. Industrial-grade MWCNTs (purity >85 wt %) were purchased from NanoLab (Waltham, Mass.), which has an average diameter of 10-30 nm and length of 5-20 μm. To directly harden the extruded material, a photoinitiator was used. 3 wt % of 2,2-dimethoxy-2-phenylacetophonene (Sigma Aldrich, Milwaukee, Wis.) was dissolved into the monomer solution. A polyurethane casting rubber was used as a substrate and cover material (Poly PT Flex 50, Polytek, Easton, Pa.).

Preparation of a MWCNTs-Polymer Solution:

To provide conductivity for a flexible material, conductive particles are introduced to a base material. The dispersion is a key process, which reduces agglomeration and precipitation of nanoparticles in a solution. 1 wt % of MWCNTs was dispersed in the prepared solution for 8 hours in an ultrasonic bath (Branson 1510, VWR). The dispersion was repeated once agglomeration and precipitation were found.

Fabrication of Robotic Tactile Sensors:

A direct-write system was developed using a micro-dispensing head (PCD3, GPD Global, Grand Junction, Colo.) installed on a precision xyz stage with resolutions of 500 nm. The PCD3 dispensing head consists of a lead-screw and stepper motor, featuring the exact volumetric dispensing due to the precise screw-driven extrusion. The stepper motor runs by changing voltage (0-10 V) so that the material can be dispensed with various extrusion speeds. The direct-write system, comprised an xyz translation mechanism, a micro-dispensing unit, and a UV lamp.

A tactile sensor was created with 10 conductive wires on the polyurethane rubber substrate using the prepared MWCNTs-polymer material. The line width and spacing are 1 mm and 2 mm, respectively. Once all the wires were created, UV light (OmniCure S2000, Lumen Dynamics Group Inc., Ontario, Canada) was illuminated to cure them. Then, the cured wires were covered again with the polyurethane rubber so that the wire pattern was encapsulated by the rubber material. The overall process included (a) pouring the rubber material, (b) curing the rubber material as a substrate, (c) creating and curing conductive wires, and (d) covering the wires with the rubber material. By repeating these processes, multiple layers with different directions of wires can be created such as a sensor comprising 4 layers (rubber—0° wires—rubber—90° wires—rubber). The fabricated robotic tactile sensor for this experiment had 10 sensor elements. The fabricated sensor is comparably flexible in both wires and substrate.

Evaluation of the Tactile Sensor:

The impedance of each conductive strip in the tactile sensor is on the order of 5MΩ. Because the resistivity of conductors is dependent upon the length, the impedance of each conductive strip within the tactile sensor is subject to change when a force is applied to bend and change the length of each strip. Resistors of comparable impedance were placed in series with each conductive strip to create a half Wheatstone Bridge for each conductor. The voltage from each half-bridge was measured with MATLAB/Simulink (The MathWorks, Natick, Mass.) with the realtime Windows target kernel. The sample rate was 1 kHz.

To evaluate the tactile sensor, several experiments were performed to illustrate the ability to measure force at distinct points on the surface and the ability to distinguish between slip and nonslip tactile events.

Test 1:

In Test 1, a 100 g mass was repeatedly placed on the tactile sensor and removed several times. During the same experiment, the 100 g mass was also slid along the surface of the tactile sensor. A fast Fourier transform (FFT) was performed in MATLAB on the voltage recorded from the tactile sensor from this experiment to illustrate the differences between the slip and nonslip events in the frequency domain.

Test 2:

In Test 2, a human fingertip was slid upward and downward along the surface of the tactile sensor perpendicular to the conductive lines of MWCNT's. The relative timing of the resultant voltage spikes of four adjacent conductive strips was measured to demonstrate two things. First, the force can be measured at distinct locations on the surface of the tactile sensor and second, the relative timing of the forces can be used to indicate the direction of sliding motion.

Figure 7:
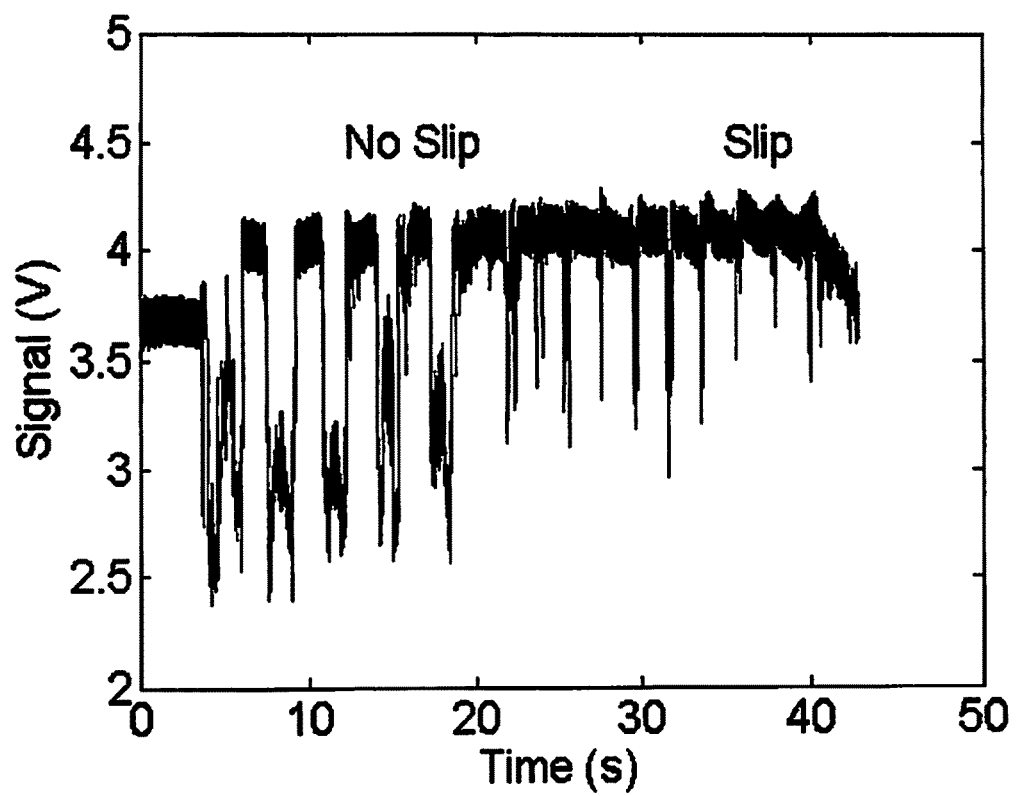
FIG. 7 is a graph showing five nonslip events during the first twenty seconds of an experiment corresponding to the placement and removal of a 100 g mass on a tactile sensor. During the last twenty seconds, the 100 g mass is slid along the surface of the tactile sensor ten times.

Results:

Test 1 Results:

The voltage recorded from the half-bridge corresponding to one conductive strip for the slip and nonslip events have fairly similar voltage amplitudes (FIG. 7). The five nonslip events occurred during the first 20 seconds of the experiment and nine slip events occurred during the second half of the experiment.

Figure 8:
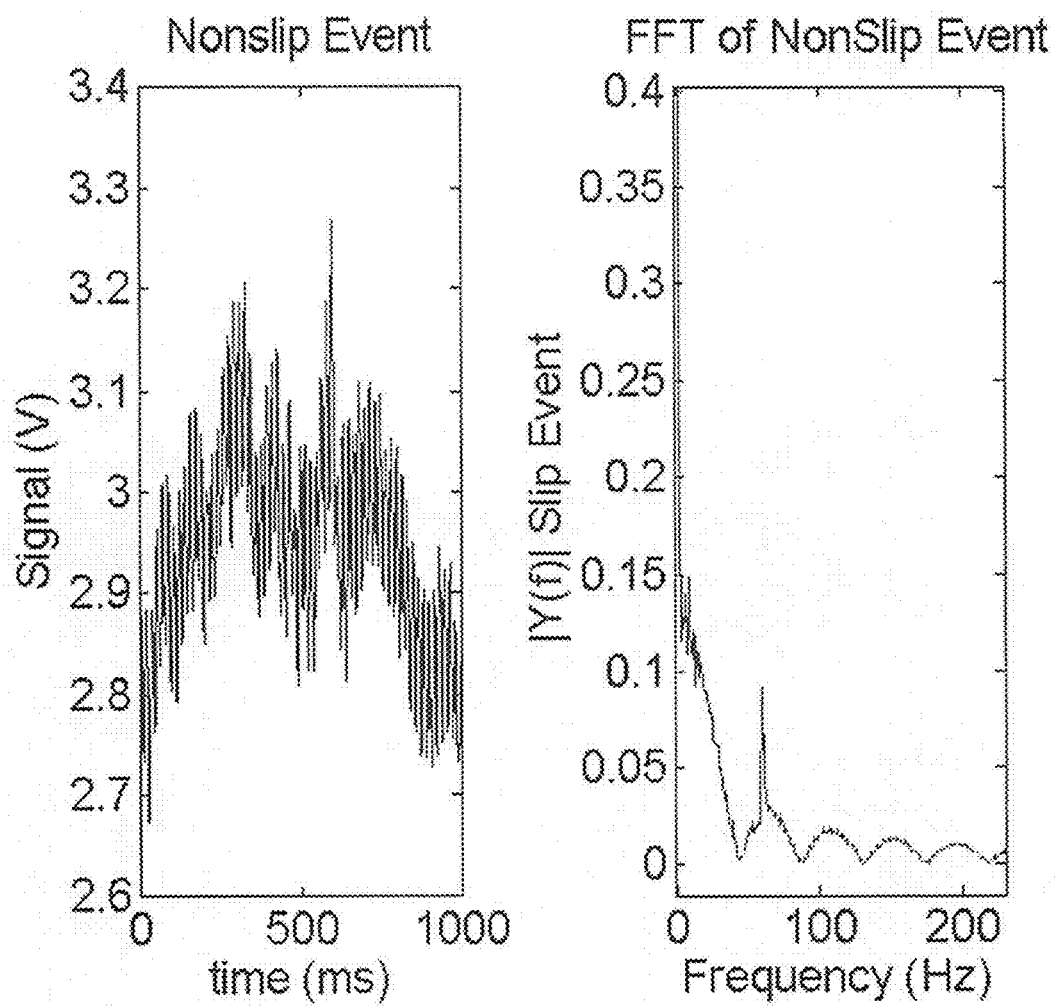
FIG. 8 is a graph showing a fast Fourier transform of nonslip event that shows very low amplitude frequency components above 40 Hz with the exception of the ubiquitous 60 Hz AC noise signal.
Figure 9:
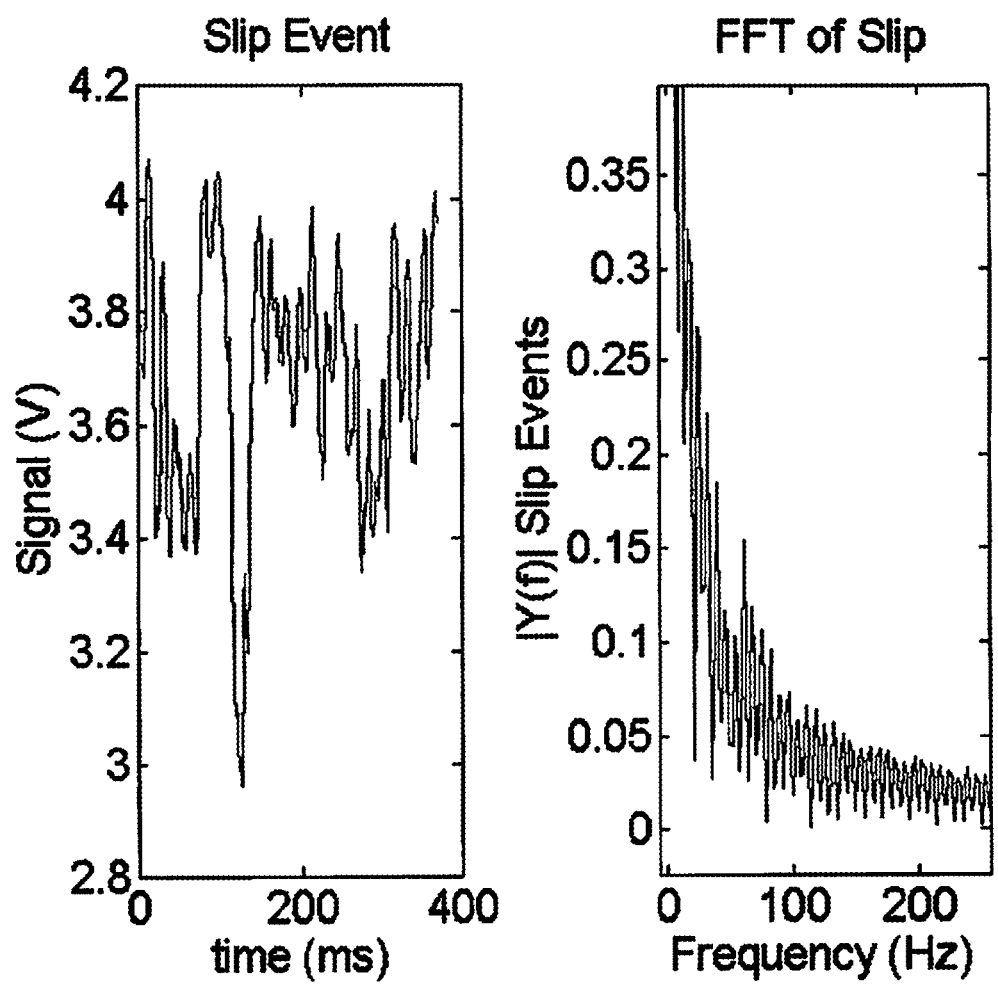
FIG. 9 is a graph showing a fast Fourier transform of a single slip event that shows there is a much stronger presence of high frequency signal components during slip.

The FFT performed on a nonslip event shows that the bulk of the signal has frequency components between 0-40 Hz with the exception of the 60 Hz AC supply (FIG. 8). However, the FFT on a slip event from the second half of the experiment shows that the power spectral density of the slip event is much more diffusely spread from 0-200 Hz (FIG. 9).

Figure 10:
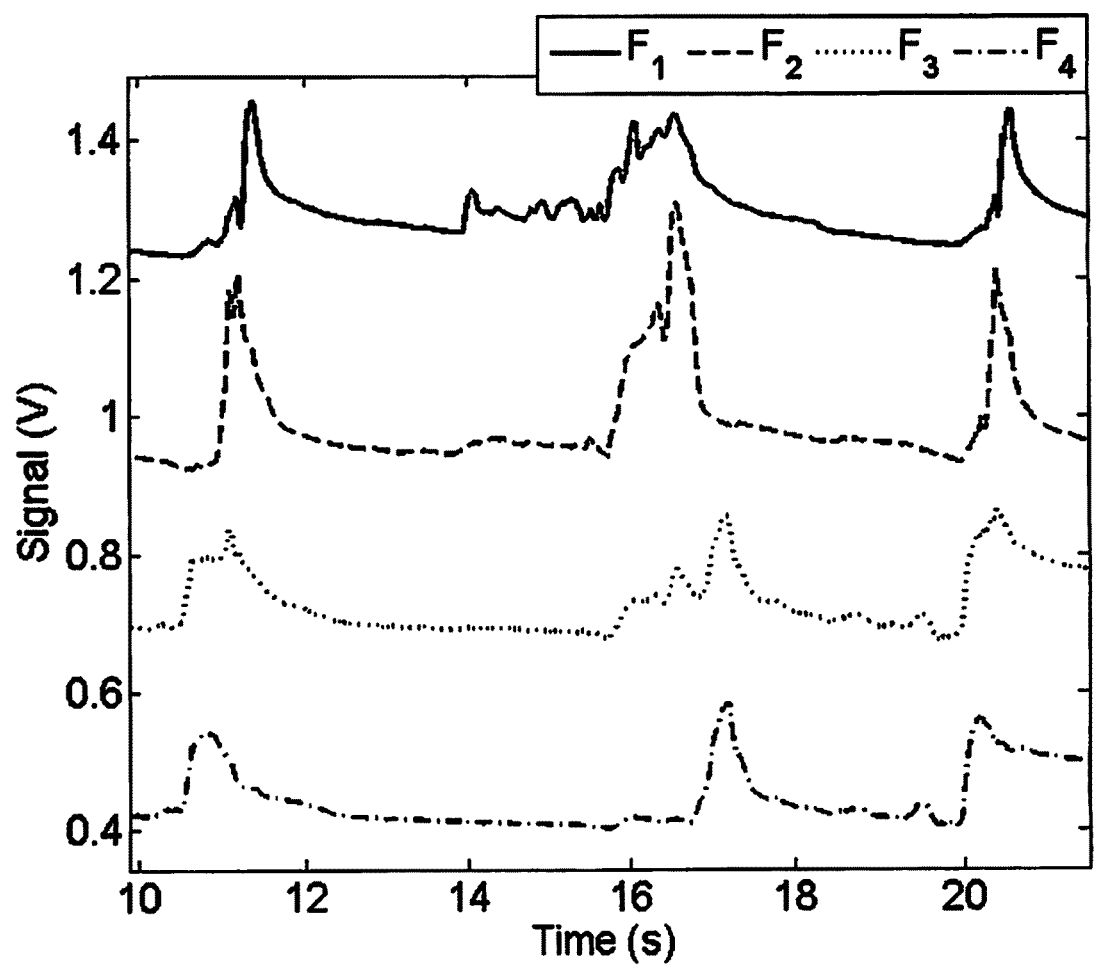
FIG. 10 is a graph showing the relative voltages from four adjacent conductive strips within a tactile sensor while a fingertip was slip upward and downward along the surface of a tactile sensor. The relative timing of each voltage peak can be used to indicate the direction of sliding motion. This also demonstrates that the force can be easily measured at distinct locations on the surface of a tactile sensor.

Test 2 Results:

The relative voltages from the half-bridges of four adjacent conductors ($F_1$, $F_2$ $F_3$ and $F_4$) within the tactile sensor while a fingertip was slip up and down along the surface of the tactile sensor show that it is feasible to detect the applied force at isolated points (FIG. 10). From the relative timing of each voltage peak from each conductive strip, it is also possible to determine the direction of the sliding motion. This is clear because the ensemble of voltage spikes for each slip event is temporally coupled. The first set of four spikes show upward slip motion because the increase in $F_4$ occurs first, followed by $F_3$, $F_2$ and then $F_1$, The second set of four voltage spikes show downward motion because the increase in $F_1$ occurs first, followed by $F_2$, $F_3$ and $F_4$. The third set of four spikes again shows upward motion. In a very real sense, decoding the relative timing of these voltage spikes is quite similar to the manner in which humans interpret the relative timing of ensembles of action potentials from mechanoreceptors of the fingertips to determine the direction that forces are applied.

In one embodiment, a tactile sensor has been developed that uses a conductive MWCNT-polymer solution embedded within a polyurethane casing. This tactile sensor is flexible and has a mechanical compliance similar to the human fingertip. One experiment has been performed which demonstrates that it is possible to distinguish between slip and nonslip events by examining the frequency content of the force signals. The force sensor signals can be passed through bandpass filters that resonate at high frequencies; this will indicate if slip does or does not occur because the nonslip events have very low signal components above 40 Hz.

Another experiment was performed that shows the ability of the tactile sensor to detect the applied force at distinct locations along the surface of the tactile sensor. The resolution of force detection is roughly the same as the spatial resolution of the strips of MWCNTs: 2 mm.

A second row of MWCNT strips can also be incorporated in a second layer underneath a top layer of MWCNTs to impart a two dimensional indication of force placement and direction of slip.

This same experiment also illustrated that the direction of the sliding motion can be detected. Interpreting the relative timing of the spikes of voltage from adjacent conductive strips can be used to indicate the direction of the motion of the applied force on the tactile sensor in much the same way that people use the relative timing of action potentials from groups of mechanoreceptors in the fingertips to indicate the direction that forces are applied.

The ability to detect slip can be incorporated with the capacity to detect the direction of sliding motion. Thus, this represents advancement over other tactile sensors because it can detect the direction that an object is slipping. The location that forces are applied can also be detected in addition to the amplitude of the applied force. These algorithms can be developed for the tactile sensor and incorporated for use with an artificial hand (FIG. 10). Thus, this invention has many applications for robotic hands and autonomous robots in general.

Example 2

Detecting Tactile Input and Location

Figure 11:
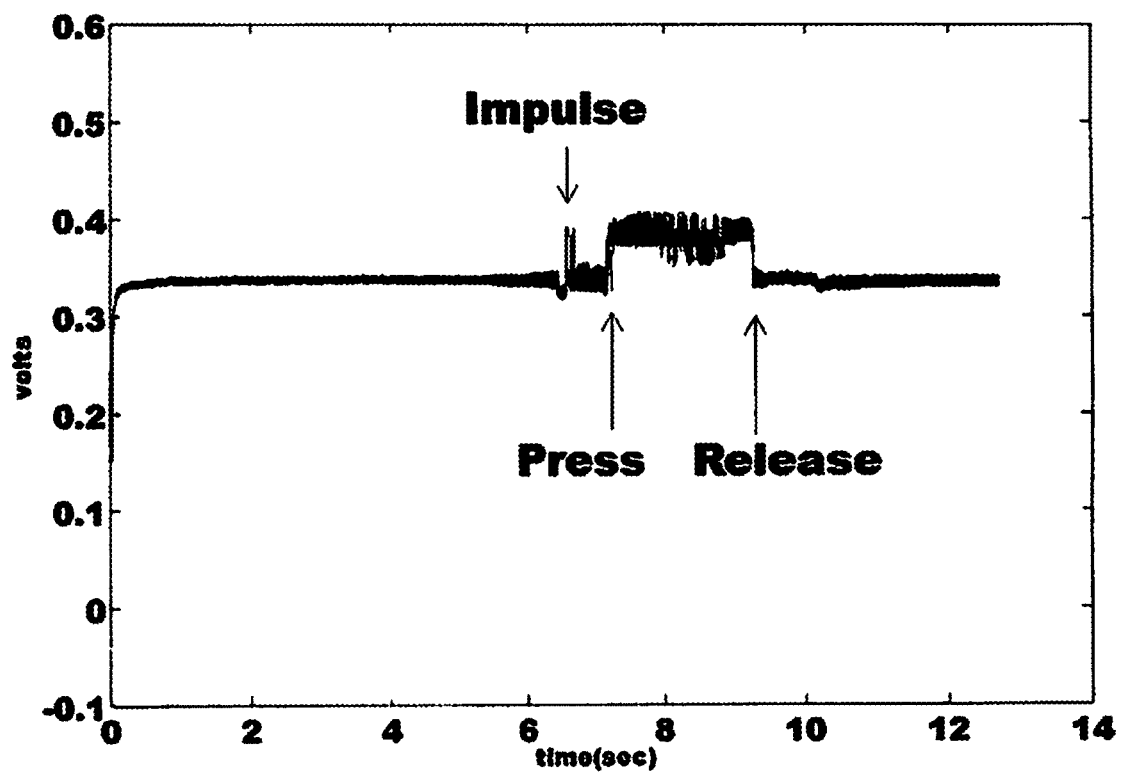
FIG. 11 is a graph showing voltage changes in the time domain for an impulse and a press and release.
Figure 12:
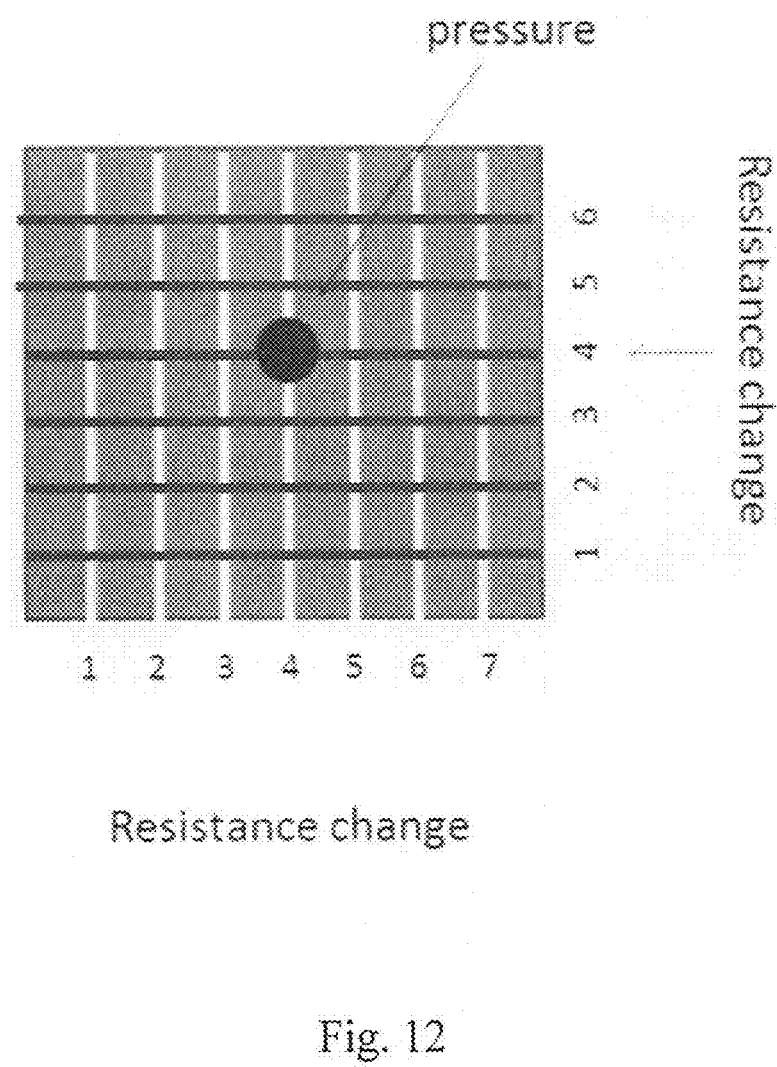
FIG. 12 is a schematic of the principle of location sensing with a multi-layer sensor.

The concept of this manufacturing method was proved by testing a sensor with two inputs such as impulse and press (and release) in the time domain, as shown in FIG. 11. To detect the location of the external input, a sensor was fabricated with 10×10 sensor elements with the width of 1 mm and spacing of 1 mm, where two layers of the sensor elements are perpendicular. When the external input occurs on top of the sensor, several sensor elements in two sensor layers will have changes of output voltage. Once voltage changes detected from two or more sensors in the different sensor layers, the location of the external input can be determined as shown in the FIG. 12. A sensor can include rigid interconnects, which will be connected to a data acquisition device.

Slip Detection:

Another experiment was conducted where the force sensor was pressed lightly, then pressed again while an object was slid over the surface of the sensor. The frequency distribution of the two events are significantly different. A filter bank can be used to distinguish between the two kinds of events. By distinguishing between the two events, it can be established whether slip occurs or not while an object is in contact with the sensor. By layering many sensors in a row, the signals from many of these sensors can be used to determine the direction that an object slips. Multiple layers of these sensors can be used to determine a 2 dimensional direction of slip vector. This is quite important in robotics and prosthetics. The feasibility of this concept is shown in FIG. 10, where slip occurs first up, then down, then back up again. The relative timing of the force signals can be used to ascertain the direction of slip. The speed of slip can also be determined by coupling the difference in time between the output of each force/slip sensor with the distance between the force sensor strips.

Example 3

Materials

A compliant tactile sensor was built from two different types of materials: mechanically compliant material and flexible conductive material. In order to make a conductive material, highly stretchable, tough, monofunctional acrylate monomer (Cyclic Trimethylolpropane Formal Acrylate, Sartomer USA, LLC, Exton, Pa.) was used as a polymer matrix. This material is photocurable and it can be cured directly after dispensed. To do this, 3 wt % photoinitiator (2,2-dimethoxy-2-phenylacetophonene, Sigma Aldrich, Milwaukee, Wis.) was blended with the polymer using a magnetic stirrer. To introduce conductivity, industrial grade MWCNTs (NanoLab, Waltham, Mass.) with the purity of more than 85 wt %, diameter of 10-30 nm, and length of 5-20 μm were dispersed into the polymer matrix. In this work, 1 wt % of MWCNTs were sonicated (Q700, Qsonica, Newtown, Conn.) for 90 min and filtered using a 200 micron filter (Sterlitech, Kent, Wash.). During the sonication, ultrasound propagation in the solution results in growth of cavities. The implosion of these cavities leads to violent and localized release of energy which can separate and disperse individual CNTs from bundles and agglomerates, where cavitation and wave propagation are directly related to the viscosity of liquid. Non-uniform energy release distribution during sonication leads to weak and non-homogeneous dispersion especially in medium to high viscosity liquid. To overcome this problem and prevent the localization of the high-energy ultrasound field around the tip of the sonicator, a combination of sonicator and magnetic stirrer was used to globally disperse the CNTs in the polymer matrix. Subsequently, the prepared material was degassed under the vacuum for 5 hours. The mechanically compliant part of this sensor was fabricated using polyurethane casting rubber material (Poly PT Flex 50, Polytek, Easton, Pa.) as a substrate (bottom), and cover (top).

Direct-Write System

A computer controlled DW system was developed using a screw-driven micro-dispensing head (PCD3, GPD Global, Grand Junction, Colo.) installed on a high precision xyz translation stage with a 500 nm resolution (Aerotech, Pittsburgh, Pa.). A four-leg optical fiber with a high-power UV lamp (OmniCure S2000, Lumen Dynamics Group Inc., Ontario, Canada) was also installed around the dispensing head to directly cure the dispensed material. The developed DW system, comprised the xyz stage, micro-dispensing device, and curing system. Controlling the speed of the xy stage, the gap distance between the tip and substrate, and the dispensing speed regulated by the input voltage of the dispensing head was used to form a precise and consistent shape of deposited sensor elements. The developed DW system is not only advantageous over conventional technologies, including the MEMS process, in creating sensing elements on conformal surfaces, but is also a low cost manufacturing process.

Fabrication of Compliant Tactile Sensors

Adjusting the dispensing parameters is critical to achieve a desired feature size and spatial resolution. It is believed that the profile shape, accuracy and consistency of the deposited material are affected by several parameters. Beside the inherent parameters of DW systems (e.g. tip geometry, and screw geometry) or fluid properties, the tip size, fluid flow rate (dispensing speed), translation speed (feed rate), and gap distance between the tip and surface are crucial factors which must be accurately adjusted. Experimental data was used help choose the parameters. FIG. 22 shows the lists of experiments to evaluate the effects of the aforementioned parameters.

A developed direct-write system was used to dispense the MWCNT/polymer composite onto a polyurethane substrate. While dispensing the material, the created wires were directly cured by UV light. Then, three widths in the same wire line were randomly selected and measured using an optical microscope (Stereo discovery V12, Carl Zeiss Micro Imaging, LLC, Thornwood, N.Y.). Experiments were repeated four times for each parameter to get an average.

To precisely maintain the same gap distances in all experiments, the distance between the dispensing tip and substrate was manually calibrated before each experiment using two different feeler gauges (300 μm and 350 μm) with the Go-No gauge manner. Using parameters based on the experiment in FIG. 22, a compliant tactile sensor was fabricated. A sensor can consist of the top and bottom layers of the polyurethane rubber, where conductive wires are embedded between these two layers with a predetermined width and spacing. The working principle of the sensor is based on the fact that the resistance changes due to the elongated wires when a force is applied. And thus, force patterns (e.g. slip and nonslip) as well as the magnitude of the applied force can be detected by recognizing changes of the resistance of the wires.

Evaluation of Compliant Tactile Sensors

The measured impedance of each conductive strip in the sensor was on the order of 5M$\Omega$. Because the resistance of conductors is dependent upon the length, the impedance of each conductive strip within the sensor is subject to change when a force is applied to bend and change the length of each strip. Resistors of comparable impedance were placed in series with each conductive strip to create a half Wheatstone Bridge for each conductor. The voltage from each half-bridge was measured with MATLAB/Simulink (The MathWorks, Natick, Mass.) with the realtime Windows target kernel. The sample rate was 1 kHz.

The tactile sensor was calibrated by pressing on each MWCNT/polymer composite strip with a LSP-10 load cell (Transducer Techniques, Temecula, USA) to measure the force while the resultant voltage change from each half bridge was measured with Simulink. To further evaluate the sensor, experiments were performed to illustrate the ability to measure force at distinct points on the surface and the ability to distinguish between slip and nonslip tactile events.

The principle for detecting slip is based on the fact that high frequency mechanical vibrations occur when one object slips against another object. These vibrations were characterized in the frequency domain for a variety of objects: steel, aluminum, plastic, and human fingertips. Those objects were first pressed against and removed from the surface of the tactile sensor (without slip) and then also slid against the surface of the sensor. The difference in the frequency domain between the two classes of tactile events was characterized with a fast Fourier transform (FFT). The FFT was performed in MATLAB on the raw, unfiltered voltage recorded from the output of the Wheatstone half bridge to illustrate the differences between the slip and nonslip events in the frequency domain.

In another set of experiments, a human fingertip was slid upward and downward along the surface of the sensor perpendicular to the conductive strips of MWCNT/polymer. Then, each MWCNT/polymer composite was individually and rapidly pressed twice at different times. The resultant voltage spikes from three adjacent conductive strips were measured from these experiments to demonstrate two things. First, the force can be measured at distinct locations on the surface of the sensor with low cross talk and second, it is possible to distinguish between slip and nonslip events.

Results and Discussion

Experimental Results: Manufacturing Parameters

Figure 13:
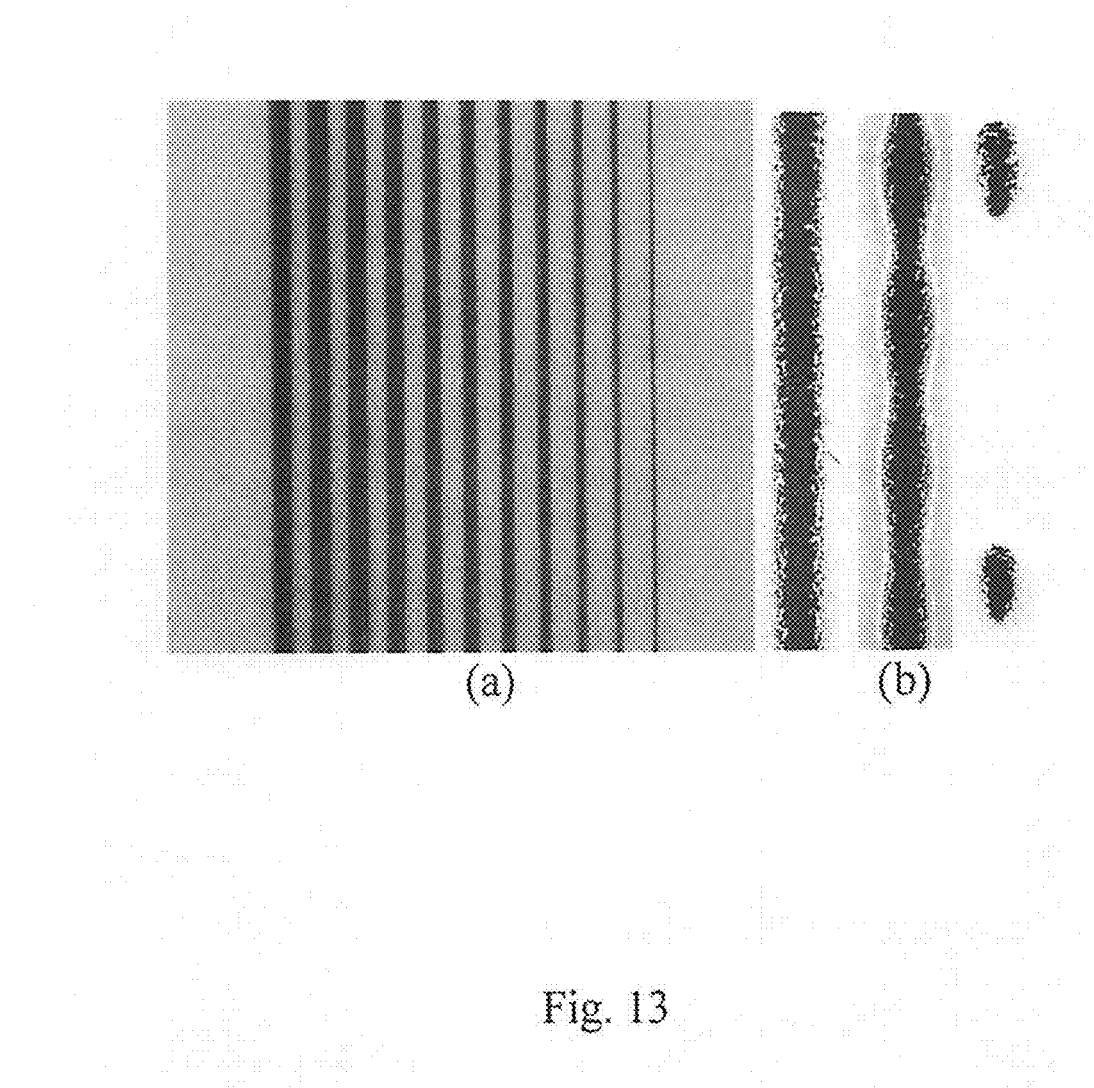
FIG. 13 is an image showing the effects of dispensing parameters on line widths: (a) line width variation according to the fluid flow rate, (b) inconsistent and discontinuous line widths caused by low fluid flow rates.
Figure 14:
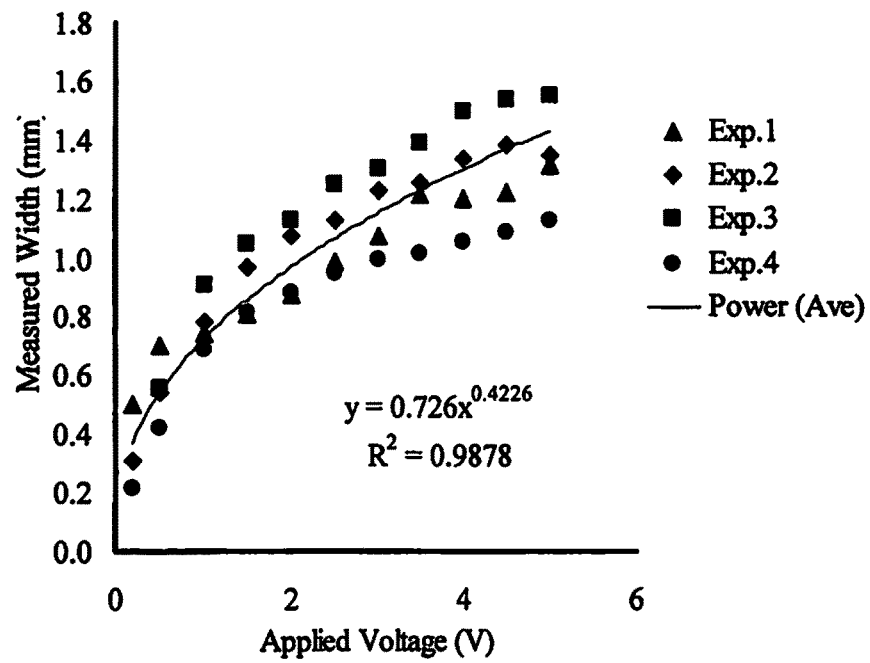
FIG. 14 is a graph showing the line width variation with respect to the fluid flow rates at fixed translation speed (tip diameter: 437 µm; translation speed: 20 mm/s; gap height: 300-350 µm).
Figure 15:
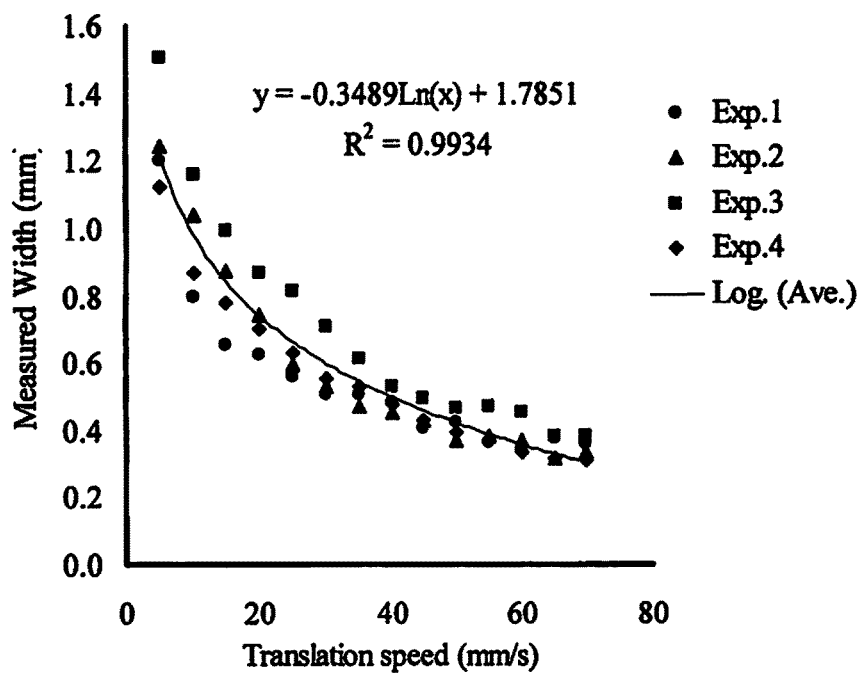
FIG. 15 is a graph showing the line width variation with respect to the translation speed at fixed fluid flow rate (tip diameter: 437 µm; fluid flow rate: 1 V; gap distance: 300-350 µm).

Dispensing parameters directly affect the size and resolution of the dispensed material. There are several parameter sets to maintain continuous and smooth flow of the material delivered from the dispensing tip to the substrate surface. FIG. 13($a$) shows the effect of the fluid flow rate on the created patterns with a fixed translation speed, where the line width decreases as the flow rate increases (high to low rate from left to right in the figure). FIG. 13($b$) shows that too low rate does not create consistent and continuous line widths. FIGS. 14 and 15 represent the results of the experiments described in FIG. 22. These results include the effects of translation speed and fluid flow rate with the other fixed parameters (see FIG. 22) on the line width of the dispensed material. There is a power relationship between the fluid flow rate and the width of created wires (FIG. 14). A logarithmic relationship exists between the translation speed and the line width (FIG. 15). Relatively larger line widths were produced compared to the tip diameter (437 µm). These data are important because they show that high flow rates and slow translation speeds result in inconsistent line widths of conductive elements.

A smaller line width than the tip size can be created by translating the stage with high speed and/or by reducing the fluid flow rate, but an excessively fast translation speed and slow fluid flow rate created the discontinuous or inconsistent line widths as shown in FIG. 13($b$). Smaller gap distances were investigated, but continuous dispensing was not possible since the material became clogged at the tip. In addition to the clogging, the dispensed material was widely spread and then narrowed on the substrate due to the pressure rise and drop.

Due to the dependency of the deposition accuracy on material and machine parameters, line width variations were observed in FIGS. 14 and 15, typically on the order of 0.3 mm. Several factors caused these line width inconsistencies. Variation of the gap distance caused inconsistent line widths. Since the polyurethane material used as the substrate is flexible with a relatively broad surface area (~10 cm×~10 cm), small variations in gap distance were unavoidable. It is expected that the use of a highly accurate and uniform substrate and/or real-time distance measurement device installed in the dispensing head would be a method to reduce this variation. Material agglomeration generated during the dispersion process is another source of line width variation. The agglomerated material sometimes partially occluded the tip and resulted in a pressure change in the tip. This pressure change caused inconsistent line widths. The material agglomeration can be improved by using a better material dispersion process and chemicals such as surfactants and dispersants. Finally, vibrations during the manufacturing process could be a reason.

There are several sets of preferred parameters for consistent line widths. A 1V flow rate and 20 mm/s translation speed were chosen to build a compliant tactile sensor with 10 conductive sensor elements (wires) with the line width of ~0.8 mm on the polyurethane substrate. While the all conductive MWCNT/polymer composite wires were dispensed on the polyurethane substrate, the UV light was illuminated to cure them simultaneously. Then, the cured wires were covered again with the polyurethane rubber material. The sensor is flexible when a force is applied.

Force and Slip Detection

Figure 16:
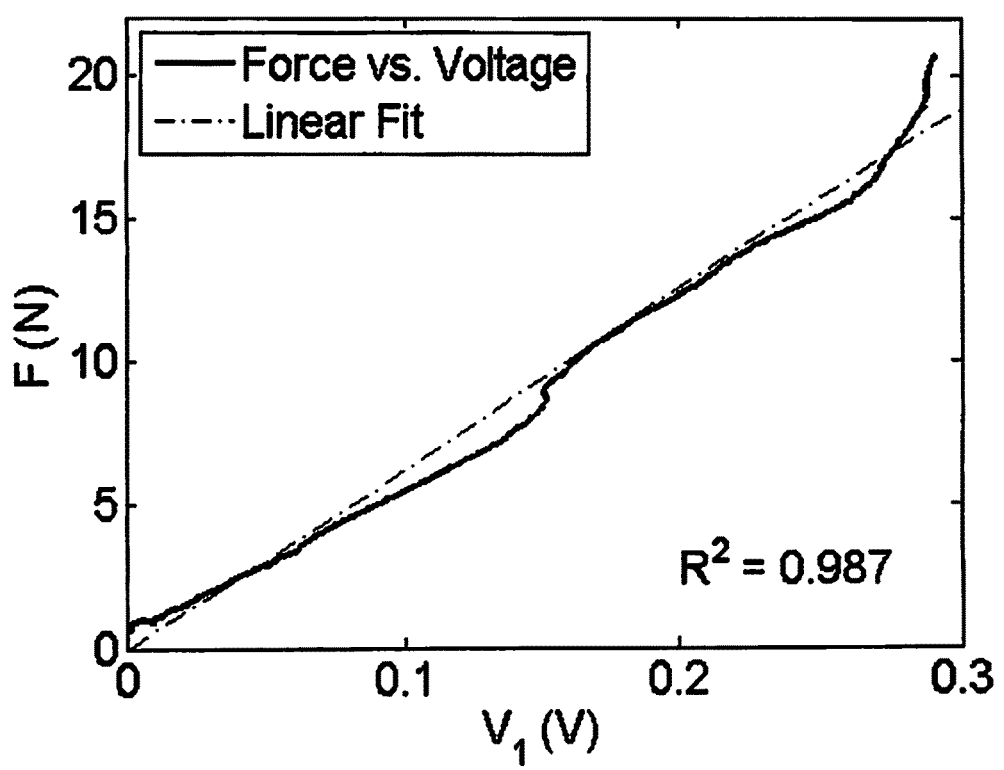
FIG. 16 is a graph showing a nearly linear relationship between the applied force (F) and the voltage (V1) measured from the output of the half Wheatstone bridges of a tactile sensor.
Figure 17:
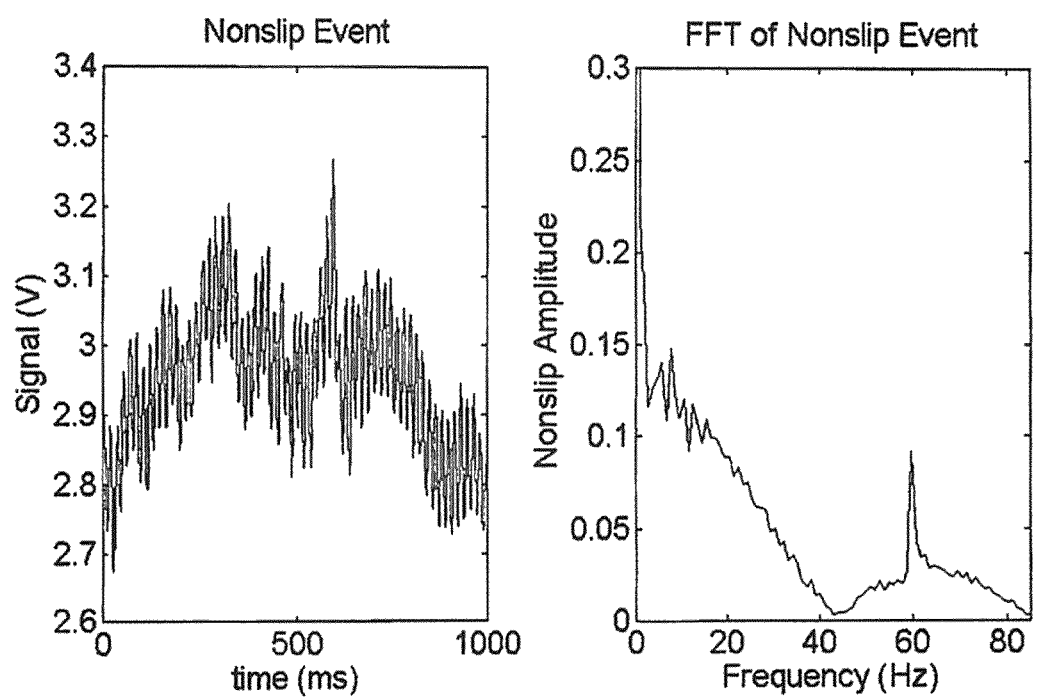
FIG. 17 is a graph showing a fast Fourier transform of a nonslip event showing very low amplitude frequency components above 40 Hz with the exception of the ubiquitous 60 Hz AC noise signal. The voltage appears noisy because it is the raw, unfiltered signal.

Calibration of the tactile sensor revealed a fairly linear relationship between applied force and the output voltage measured from the half Wheatstone bridge (FIG. 16). The FFT performed on a nonslip event (when a steel mass was placed atop the sensor) shows that the bulk of the signal has frequency components between 0-40 Hz with the exception of the 60 Hz AC supply (FIG. 17). However, the FFT of a slip event from when a steel object was slid along the surface of the sensor shows that the power spectral density of the slip event is much more diffusely spread from 0-90 Hz (FIG. 10). This is due to the mechanical vibrations that occur during sliding motion. This phenomenon was observed for the steel, aluminum, and plastic objects as well as when a human fingertip was slid across the surface of the tactile sensor. These differences in the frequency response of the slip and nonslip events can be used to distinguish between the two different classes of tactile events.

Figure 18:
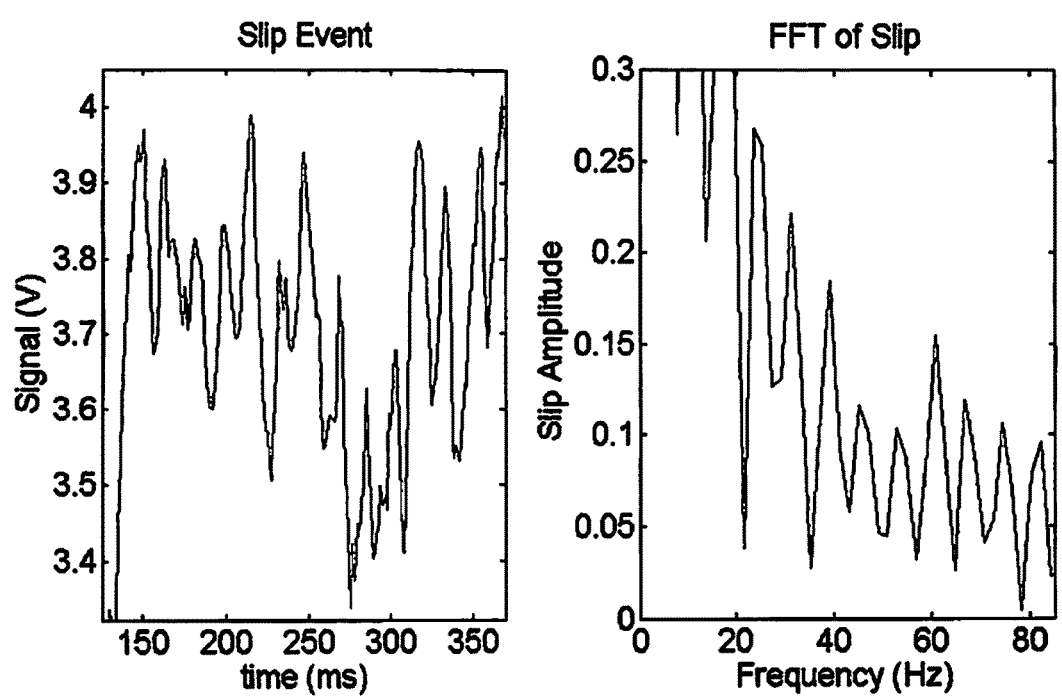
FIG. 18 is a graph showing a fast Fourier transform of a single slip event showing that there is a much stronger presence of high frequency signal components during slip. The voltage appears noisy because it is the raw, unfiltered signal.

To that end, a four pole Chebyshev band pass filter was designed in MATLAB to amplify frequency components between 40 Hz and 45 Hz because this is where the greatest difference between the slip and nonslip events was observed for each object (FIGS. 17 and 18). All other frequencies received 60 dB attenuation. The absolute value of the band pass filtered signal was then used as an indicator of slip.

Figure 19:
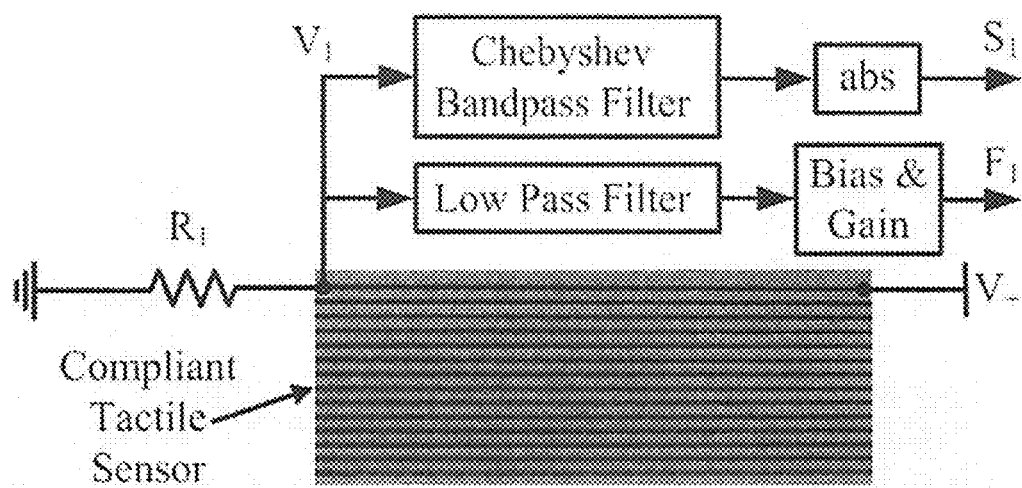
FIG. 19 is a simple schematic of the electrical connections and signal processing for a single electrically conductive strip for a tactile sensor. A resistor (R1) is connected to ground and placed in series with the MWCNT/polymer composite strip to create a half Wheatstone bridge with excitation voltage V+. To detect the force applied to the first strip (F1), the raw voltage output from the Wheatstone bridge (V1) is low pass filtered, and given a bias and gain corresponding to slope of the calibration plot. Slip is detected by passing the raw voltage through a four pole Chebyshev band pass filter to amplify the frequency components of V1 from 40 to 45 Hz that are present when slip occurs that are absent when slip does not occur. The absolute value of the band pass filtered version of V1 is used to indicate slip, S1. This same process can be used for any arbitrary number of strips depending upon the needs of the application.

As is clear from FIG. 19, the raw, unfiltered voltage output from each MWCNT/polymer composite conductor was used to indicate the force amplitude and also whether or not tactile events corresponded to slip or nonslip events. In one path, the raw voltage is low pass filtered and then given a gain and bias corresponding to the calibration of force vs. voltage (FIG. 16) to indicate the applied force. In the second path, the absolute value of the band pass filtered signal is used to detect slip.

Figure 20:
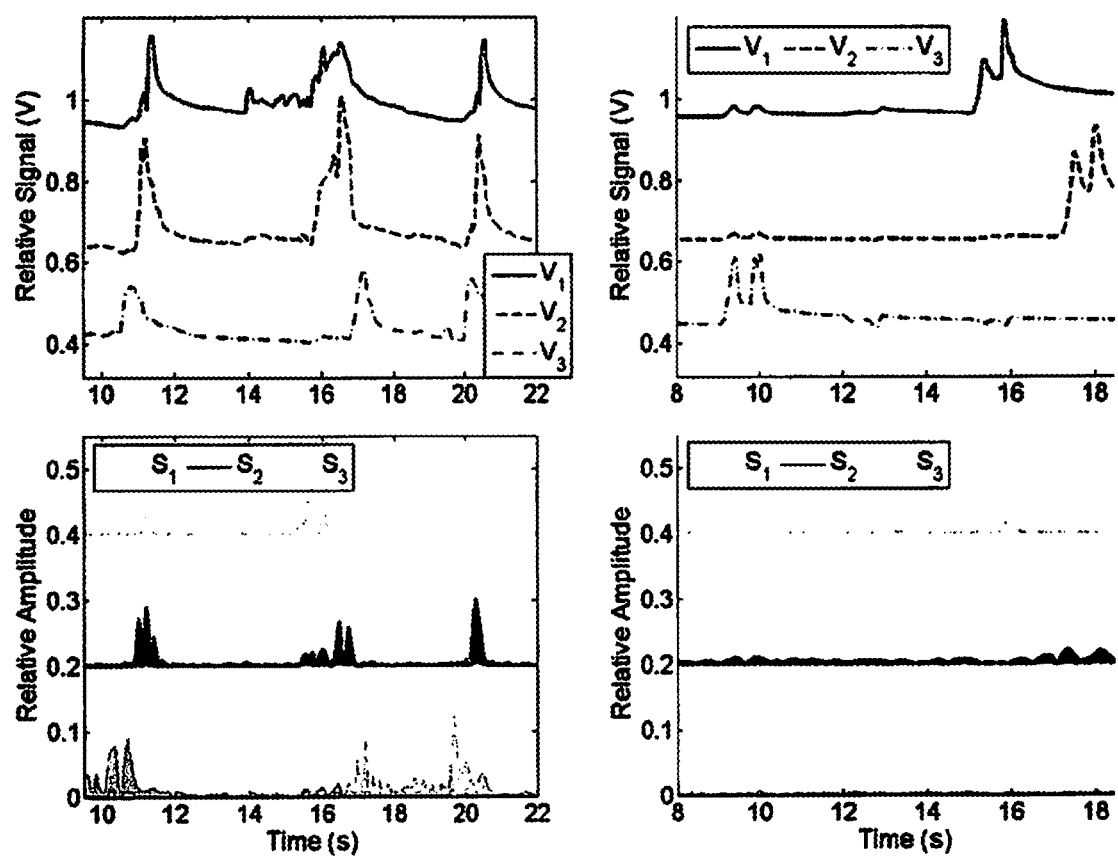
FIG. 20 is a graph showing the relative voltages from three adjacent conductive strips within the tactile sensor (V1, V2, and V3) during two different experiments. In the left hand column, a fingertip was slid upward, downward, and then upward again along the surface of a tactile sensor. The corresponding slip signals (S1, S2, and S3) in the bottom left increase substantially during each slip event. In a second experiment (right hand column), each strip was tapped twice quickly at different times. The corresponding slip signals in the bottom right are not sensitive to this type of force application since slip did not occur. Thus, these experiments demonstrate that it is possible to distinguish between slip and nonslip events, that forces can be easily measured at distinct locations on the surface of the tactile sensor, and that the cross talk between adjacent strips is low.

To illustrate the slip detection capabilities, the relative voltages from three adjacent conductors (V1, V2, and V3) and the corresponding slip signals (S1, S2, and S3) while a fingertip was slid up, down, and up again along the surface of the compliant tactile sensor show that it is feasible to detect slip (FIG. 20, left column) In this case, the output of each band pass filter amplified the vibrations that occurred during the slip events. In another experiment, the three conductive strips were pressed twice quickly at different times. The corresponding slip signals in these experiments are not sensitive to this type of tactile event (FIG. 20, right column) because slip did not occur. Rapidly pressing the each conductive strip twice without slip was used to show that quickly changing nonslip tactile events are unlikely to cause a false indication of slip. FIG. 20 also shows that the cross talk among conductive strips is quite low so the location of a force applied to the surface of the tactile sensor can be measured with a spatial resolution of approximately 2 mm.

Finally, the relative timing between the spikes in force detected in each conductive strip cannot be used as an indicator of slip because that could easily be caused by rolling motion (where there is no slip) or by an irregularly shaped object in contact with the sensor. For example, if the tactile sensor was pressed against a conical object, the timing of the force signals would sequentially increase as each part of the sensor made contact with the side of the cone. This could be mistaken as slip unless the frequency domain was analyzed for vibrations caused by slip.

Due to the lack of economic, flexible and mechanically compliant tactile sensors, a hybrid DW manufacturing process was developed to fabricate compliant tactile sensors. A micro-dispensing DW system was developed and dispensing parameters were experimentally investigated to create a predetermined wire size. Several sensors were produced by creating flexible conductive wires with a MWCNT/polymer composite on a layer of polyurethane rubber. Forces applied to the sensor were able to be consistently measured. The sensor was also shown to be sensitive to mechanical vibrations that occur during slip. These nonslip events could be distinguished from slip events with an FFT that showed a greater high frequency power spectral density characterizing the slip events. A four pole Chebyshev filter was designed to amplify the vibrations that occur during slip to distinguish between the two classes of tactile events. Hence, it is concluded that the suggested materials and manufacturing system for sensors are promising and the developed sensor has a wide range of applications for dexterous manipulation in robotics and prosthetics.

In light of the foregoing, it should be appreciated that the present invention significantly advances the art by providing an improved and flexible tactile sensor. While particular embodiments of the invention have been disclosed in detail herein, it should be appreciated that the invention is not limited thereto or thereby inasmuch as variations on the invention herein will be readily appreciated by those of ordinary skill in the art. The scope of the invention shall be appreciated from the claims that follow.

What is claimed is:

1. A tactile sensor comprising:
a flexible medium; and
an array of electrically conductive strips extending in a first direction and respectively terminated at a first end and a second end, wherein said electrically conductive strips are embedded in said flexible medium, with said first end and said second end of each said conductive strip positioned outside of the flexible medium,
wherein said electrically conductive strips include conductive nanostructures dispersed in a polymeric flexible material, and
wherein said first end and said second end of each said electrically conductive strip are adapted to be connected to an impedance measuring device to measure the impedance thereof.

2. The tactile sensor of claim 1, wherein said flexible medium is stretchable.

3. The tactile sensor of claim 1, wherein said electrically conductive strips are aligned as straight strips, two-dimensional curved strips, three-dimensional curved strips, or wavy patterned strips.

4. The tactile sensor of claim 1, wherein said impedance measuring device is a Wheatstone bridge.

5. The tactile sensor of claim 1, wherein said flexible medium is made from polyurethane.

6. The tactile sensor of claim 1, wherein said conductive nanostructures comprise conductive nanowires, carbon nanotubes, or graphene.

7. The tactile sensor of claim 1, wherein said nanostructures are multi-walled carbon nanotubes.

8. The tactile sensor of claim 1, wherein said electrically conductive strips contain from 0.01 wt % to 10 wt % carbon nanotubes.

9. The tactile sensor of claim 8, wherein said carbon nanotubes have an average length from 300 nanometers to 30 microns.

10. The tactile sensor of claim 1, wherein said sensor comprises four independent sensor units.

11. The tactile sensor of claim 10, wherein said sensor units each have a first array of electrically conductive strips extending in said first direction, and a second array of electrically conductive strips extending in a second direction that is off of parallel as compared to said first direction of said first array.

12. The tactile sensor of claim 1, wherein the width of each electrically conductive strip is substantially constant throughout the length of each electrically conductive strip.

13. The tactile sensor of claim 1, further comprising a second array of electrically conductive strips extending in a second direction that is off of parallel as compared to said first direction of said first array.

14. The tactile sensor of claim 13, wherein said second direction of said second array is orthogonal to said first direction of said first array.

15. The tactile sensor of claim 1, wherein the tactile sensor detects:
(a) applied force,
(b) slip events,
(c) slip direction,
(d) slip speed,
(e) slip velocity,
(f) rolling contact or
(g) the shape of an object in contact with said tactile sensor.

16. A method of making a tactile sensor, comprising:
(a) pouring an elastomeric material into a mold to form a first layer of elastomeric material;
(b) curing the first layer of elastomeric material;
(c) depositing a mixture of prepolymer and carbon nanotubes on the first layer of elastomeric material to form conductive strips that are respectively terminated at a first end and a second end;
(d) curing the conductive strips;
(e) pouring an elastomeric material onto the first layer of elastomeric material and conductive strips to cover the first layer of elastomeric material and conductive strips to form a second layer of elastomeric material, wherein the first end and the second end of each said conductive strip are positioned outside of the first and second layers of the elastomeric material; and
(f) curing the second layer of elastomeric material.

17. The method of claim 16, wherein the first layer elastomeric material and second layer elastomeric material are comprised of stretchable polyurethane material.

18. The method of claim 16, wherein the mixture of prepolymer and carbon nanotubes is deposited via a micro-dispensing head.

19. The method of claim 18, wherein the mixture of prepolymer and carbon nanotubes is directly cured into strips using UV light.

20. A method of making a tactile sensor, comprising:
(a) pouring an elastomeric material into a mold to form a first layer of elastomeric material;
(b) curing the first layer of elastomeric material;
(c) depositing a mixture of prepolymer and carbon nanotubes on the first layer of elastomeric material to form conductive strips that are respectively terminated at a first end and a second end;
(d) curing the conductive strips;
(e) pouring an elastomeric material onto the first layer of elastomeric material and conductive strips to cover the first layer of elastomeric material and conductive strips to form a second layer of elastomeric material, wherein the first end and the second end of each conductive strip are positioned outside of the first and second layers of elastomeric material; and
(f) curing the second layer of elastomeric material, wherein the steps of (b) through (e) are repeated in order to create a tactile sensor having multiple layers.

* * * * *